US008289783B2

(12) United States Patent
Shibata

(10) Patent No.: US 8,289,783 B2
(45) Date of Patent: Oct. 16, 2012

(54) SEMICONDUCTOR MEMORY DEVICE CAPABLE OF SUPPRESSING PEAK CURRENT

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/948,256

(22) Filed: Nov. 17, 2010

(65) Prior Publication Data

US 2011/0058416 A1 Mar. 10, 2011

Related U.S. Application Data

(63) Continuation of application No. 12/179,076, filed on Jul. 24, 2008, now Pat. No. 7,855,914.

(30) Foreign Application Priority Data

Jul. 31, 2007 (JP) ................................. 2007-199947

(51) Int. Cl.
*G11C 11/34* (2006.01)
*G11C 16/04* (2006.01)

(52) U.S. Cl. ......... 365/185.28; 365/185.03; 365/185.17; 365/185.22

(58) Field of Classification Search ............. 365/185.03, 365/185.17, 185.22, 185.28, 220
See application file for complete search history.

(56) References Cited

U.S. PATENT DOCUMENTS

| 4,534,055 A * | 8/1985 | Iinuma ........................... 704/206 |
| 4,766,573 A | 8/1988 | Takemae |
| 5,835,969 A | 11/1998 | Inagaki et al. |
| 5,854,767 A | 12/1998 | Nishi et al. |
| 6,363,010 B2 | 3/2002 | Tanaka et al. |
| 6,657,891 B1 | 12/2003 | Shibata et al. |
| 6,732,322 B1 * | 5/2004 | Miyauchi et al. ............. 714/784 |
| 6,876,578 B2 | 4/2005 | Shibata et al. |
| 6,925,004 B2 | 8/2005 | Shibata et al. |
| 7,016,226 B2 | 3/2006 | Shibata et al. |
| 7,120,052 B2 | 10/2006 | Shibata et al. |
| 7,315,471 B2 | 1/2008 | Shibata et al. |
| 2002/0023191 A1 | 2/2002 | Fudeyasu |
| 2002/0097603 A1 * | 7/2002 | Tanaka et al. ............ 365/185.03 |
| 2006/0239071 A1 | 10/2006 | Ohta |
| 2007/0109854 A1 | 5/2007 | Shibata |

FOREIGN PATENT DOCUMENTS

| JP | 10-055687 | 2/1998 |
| JP | 2000-163976 | 6/2000 |
| JP | 2000-276887 | 10/2000 |
| JP | 2004-192789 | 7/2004 |
| JP | 2005-100527 | 4/2005 |

OTHER PUBLICATIONS

Office Action issued Feb. 28, 2012, in Japanese Patent Application No. 2007-199947, (with English-language Translation).

* cited by examiner

*Primary Examiner* — Ly D Pham
(74) *Attorney, Agent, or Firm* — Oblon, Spivak, McClelland, Maier & Neustadt, L.L.P.

(57) ABSTRACT

A memory cell array includes a plurality of memory cells, in which n (n is a natural number equal to 3 or larger) cells are simultaneously written. A control circuit controls the memory cell array. A conversion circuit converts data constituted of k (k is equal to n or smaller, and is a natural number equal to 3 or larger) bits stored in the memory cells into data of h (h is equal to k or larger, and is a natural number equal to 2 or larger) bits on the basis of a conversion rule.

4 Claims, 16 Drawing Sheets

| | x4 | x3 | x2 | x1 |
|---|---|---|---|---|
| 1 | 0 | 0 | 0 | 1 |
| 2 | 0 | 0 | 1 | 1 |
| 3 | 0 | 1 | 1 | 1 |
| 4 | 1 | 1 | 1 | 1 |
| 5 | 1 | 1 | 1 | 0 |
| 6 | 1 | 1 | 0 | 1 |
| 7 | 1 | 0 | 1 | 0 |
| 8 | 0 | 1 | 0 | 1 |
| 9 | 1 | 0 | 1 | 1 |
| 10 | 0 | 1 | 1 | 0 |
| 11 | 1 | 1 | 0 | 0 |
| 12 | 1 | 0 | 0 | 1 |
| 13 | 0 | 0 | 1 | 0 |
| 14 | 0 | 1 | 0 | 0 |
| 15 | 1 | 0 | 0 | 0 |

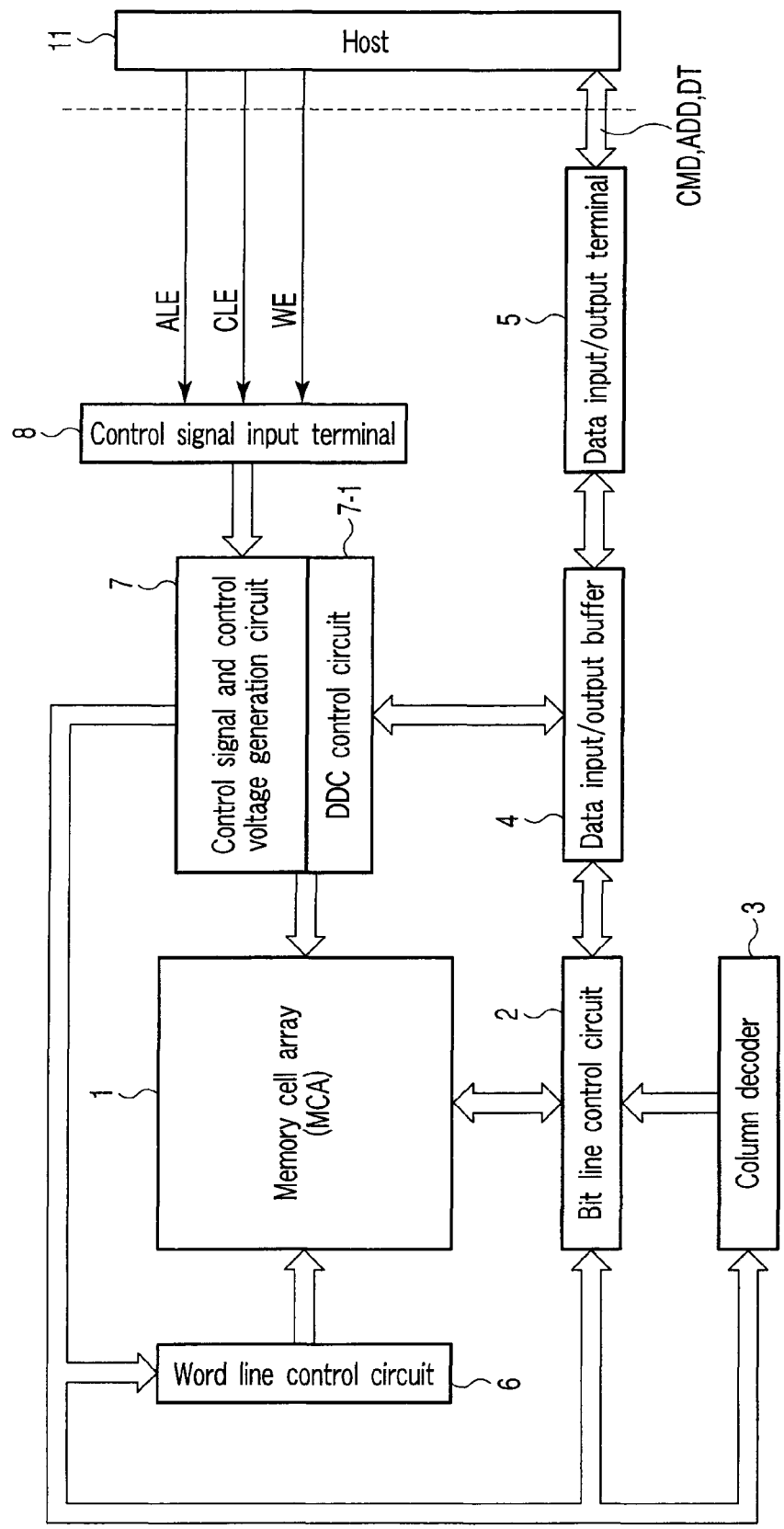
F I G. 2

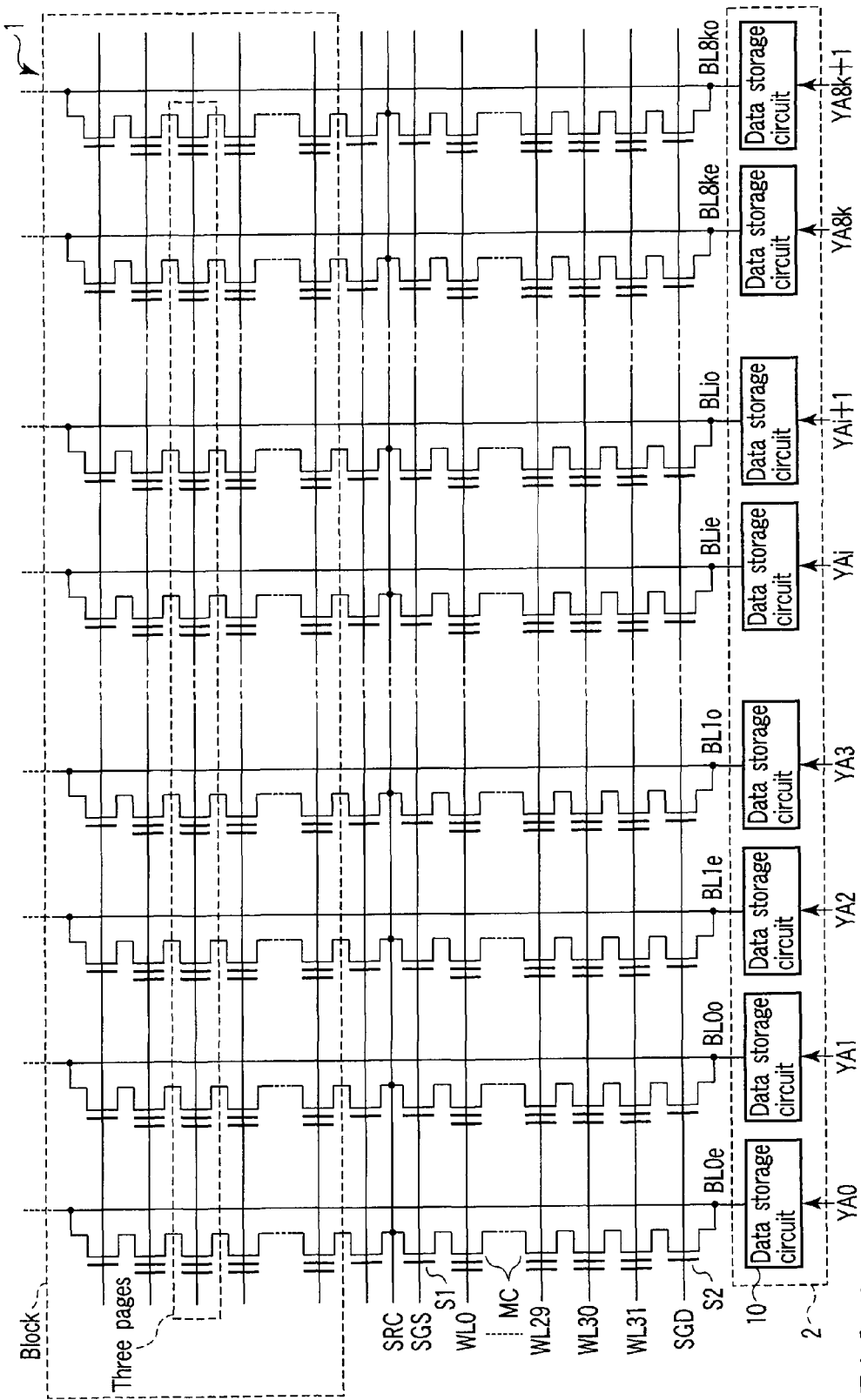
F I G. 4

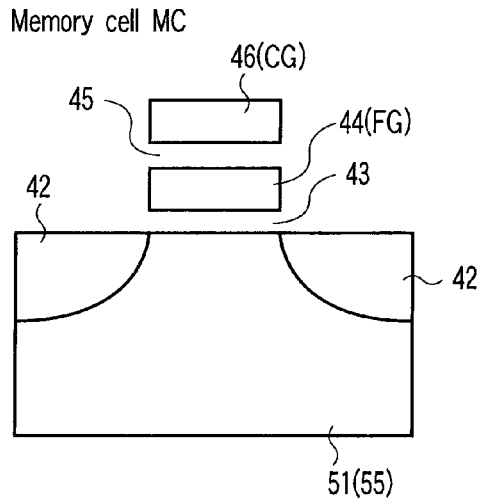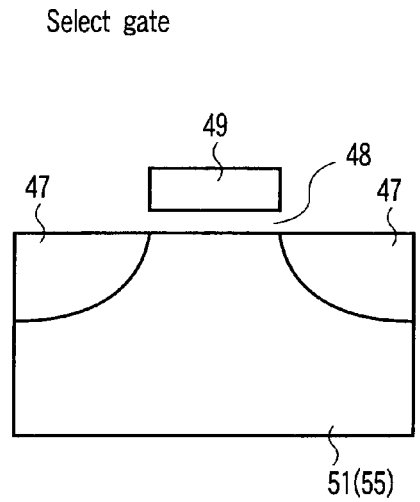
FIG. 5A     FIG. 5B
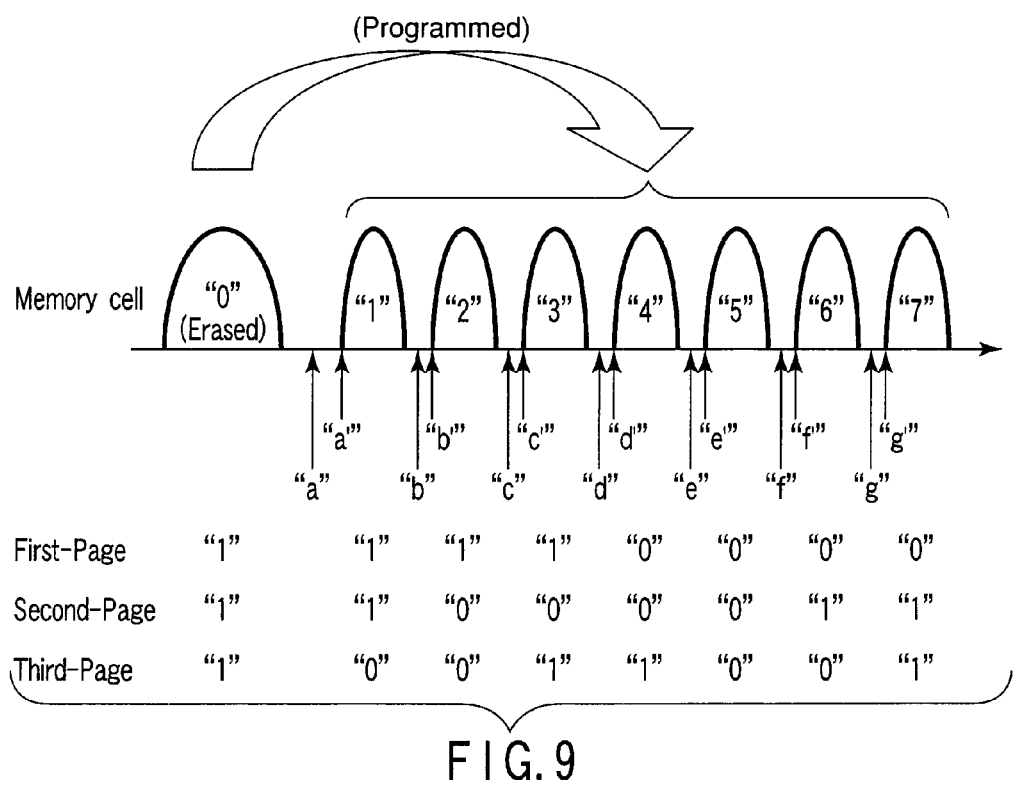
FIG. 9

|  | Cell (P-well) | Cell (N-well) | H.V.Tr (P-sub) | L.V.Nch(P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V)/Vpgmh |
| Read | Vss (0V) | Vss (0V) | Vss (0V) | Vss (0V) | Vdd (2.5V) | Vdd (2.5V)/Vreadh |

F I G. 7

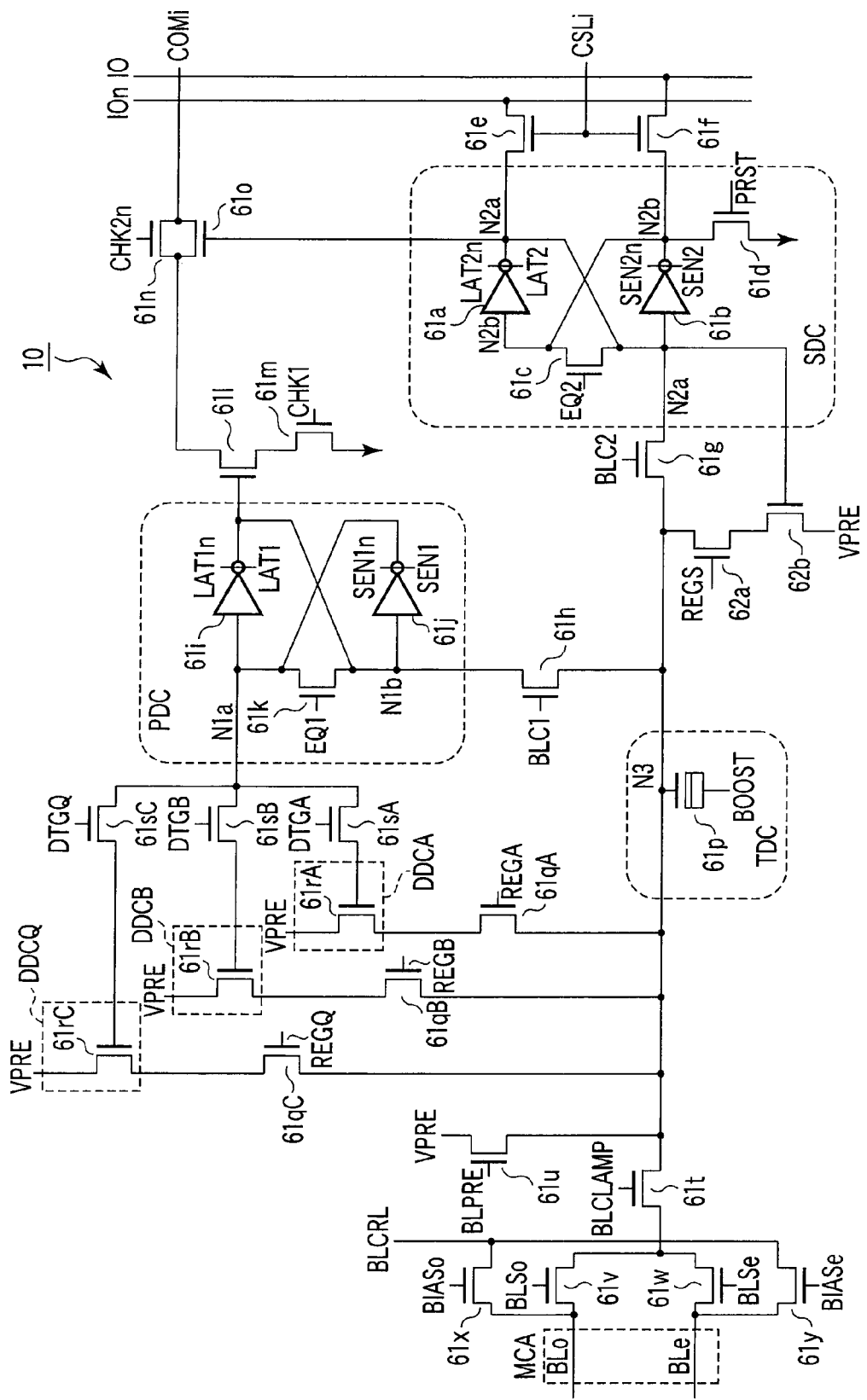
F I G. 8

| Example 1 Input | Additional data |
|---|---|
| 0 0 0 0 | 1 1 |
| 0 0 0 1 | 1 1 |
| 0 0 1 0 | 1 1 |
| 0 0 1 1 | 0 1 |
| 0 1 0 0 | 1 1 |
| 0 1 0 1 | 0 1 |
| 0 1 1 0 | 0 1 |
| 0 1 1 1 | 0 0 |
| 1 0 0 0 | 1 1 |
| 1 0 0 1 | 0 1 |
| 1 0 1 0 | 0 1 |
| 1 0 1 1 | 0 0 |
| 1 1 0 0 | 0 1 |
| 1 1 0 1 | 0 0 |
| 1 1 1 0 | 0 0 |
| 1 1 1 1 | 0 0 |

When number of "0" is three or more, add "1" "1"
When number of "1" is three or more, add "0" "0"
In other cases, add "0" "1"

FIG. 12A

| Example 2 Input | Additional data |
|---|---|
| 0 0 0 0 0 0 0 | 1 1 |
| 0 0 0 0 0 0 1 | 1 1 |
| 0 0 0 0 0 1 0 | 1 1 |
| 0 0 0 0 0 1 1 | 1 1 |
| 0 0 0 0 1 0 0 | 1 1 |
| 0 0 0 0 1 0 1 | 1 1 |
| 0 0 0 0 1 1 0 | 1 1 |
| 0 0 0 0 1 1 1 | 1 1 |
| 0 0 0 1 0 0 0 | 1 1 |
| 0 0 0 1 0 0 1 | 1 1 |
| 0 0 0 1 0 1 0 | 1 1 |
| 0 0 0 1 0 1 1 | 1 1 |
| 0 1 1 0 1 0 0 | 0 1 |
| 0 1 1 0 1 0 1 | 0 0 |
| 0 1 1 0 1 1 0 | 0 0 |
| 0 1 1 0 1 1 1 | 0 0 |
| 1 0 0 0 1 0 0 | 1 1 |
| 1 0 0 0 1 0 1 | 1 1 |
| 1 0 0 0 1 1 0 | 1 1 |
| 1 0 0 0 1 0 1 | 0 1 |
| 1 1 1 0 1 0 0 | 0 0 |
| 1 1 1 0 1 0 1 | 0 0 |
| 1 1 1 0 1 1 0 | 0 0 |
| 1 1 1 0 1 1 1 | 0 0 |
| 1 1 1 1 0 0 0 | 0 0 |
| 1 1 1 1 0 0 1 | 0 0 |
| 1 1 1 1 0 1 0 | 0 0 |
| 1 1 1 1 0 1 1 | 0 0 |
| 1 1 1 1 1 0 0 | 0 0 |
| 1 1 1 1 1 0 1 | 0 0 |
| 1 1 1 1 1 1 0 | 0 0 |
| 1 1 1 1 1 1 1 | 0 0 |

When number of "0" is five or more, add "1" "1"
When number of "1" is five or more, add "0" "0"
In other case, add "0" "1"

FIG. 12B

Before data set

FIG. 14A

| Write Level | 0 | 1 | 2 | 3 | 4 | 5 | 6 | 7 | |
|---|---|---|---|---|---|---|---|---|---|
| DDCA | 1 | 1 | 1 | 1 | 0 | 0 | 0 | 0 | First Page |
| DDCB | 1 | 1 | 0 | 0 | 0 | 0 | 1 | 1 | Second Page |
| SDC | 1 | 0 | 0 | 1 | 1 | 0 | 0 | 1 | Third page |

After data set (conventional example)

FIG. 14B

| Write Level | 0 | 1 | 2 | 3 | 4 | 5 | 6 | 7 |
|---|---|---|---|---|---|---|---|---|
| DDCA | 0 | 1 | 0 | 1 | 0 | 1 | 0 | 1 |
| DDCB | 0 | 0 | 1 | 1 | 0 | 0 | 1 | 1 |
| SDC | 0 | 0 | 0 | 0 | 1 | 1 | 1 | 1 |
| DDCQ | 1 | 0 | 0 | 0 | 0 | 0 | 0 | 0 |
| PDC | 1 | 0 | 0 | 0 | 0 | 0 | 0 | 0 |

After data set (present invention)

FIG. 14C

| Write level | 0 | 1 | 2 | 3 | 4 | 5 | 6 | 7 |
|---|---|---|---|---|---|---|---|---|
| DDCA | 0 | 1 | 0 | 1 | 0 | 1 | 0 | 1 |
| DDCB | 0 | 0 | 1 | 0 | 1 | 1 | 1 | 1 |
| SDC | 0 | 0 | 0 | 0 | 1 | 0 | 0 | 0 |
| DDCQ | 1 | 0 | 1 | 1 | 1 | 1 | 1 | 1 |
| PDC | 1 | 0 | 1 | 1 | 1 | 1 | 1 | 1 |

Rate at which bit lines become "0" (conventional example)

| Write Level | 0 | 1 | 2 | 3 | 4 | 5 | 6 | 7 | |
|---|---|---|---|---|---|---|---|---|---|
| Loop 1 | | (1/8)*10/10 | (1/8)*10/10 | (1/8)*10/10 | (1/8)*10/10 | (1/8)*10/10 | (1/8)*10/10 | (1/8)*10/10 | 0.875 |
| Loop 2 | | (1/8)*9/10 | (1/8)*10/10 | (1/8)*10/10 | (1/8)*10/10 | (1/8)*10/10 | (1/8)*10/10 | (1/8)*10/10 | 0.8625 |
| Loop 3 | | (1/8)*8/10 | (1/8)*9/10 | (1/8)*10/10 | (1/8)*10/10 | (1/8)*10/10 | (1/8)*10/10 | (1/8)*10/10 | 0.8375 |
| Loop 4 | | (1/8)*7/10 | (1/8)*8/10 | (1/8)*9/10 | (1/8)*10/10 | (1/8)*10/10 | (1/8)*10/10 | (1/8)*10/10 | 0.8 |
| Loop 5 | | (1/8)*6/10 | (1/8)*7/10 | (1/8)*8/10 | (1/8)*9/10 | (1/8)*10/10 | (1/8)*10/10 | (1/8)*10/10 | 0.75 |
| Loop 6 | | (1/8)*5/10 | (1/8)*6/10 | (1/8)*7/10 | (1/8)*8/10 | (1/8)*9/10 | (1/8)*10/10 | (1/8)*10/10 | 0.6875 |
| Loop 7 | | (1/8)*4/10 | (1/8)*5/10 | (1/8)*6/10 | (1/8)*7/10 | (1/8)*8/10 | (1/8)*9/10 | (1/8)*10/10 | 0.6125 |
| Loop 8 | | (1/8)*3/10 | (1/8)*4/10 | (1/8)*5/10 | (1/8)*6/10 | (1/8)*7/10 | (1/8)*8/10 | (1/8)*9/10 | 0.525 |
| Loop 9 | | (1/8)*2/10 | (1/8)*3/10 | (1/8)*4/10 | (1/8)*5/10 | (1/8)*6/10 | (1/8)*7/10 | (1/8)*8/10 | 0.4375 |
| Loop 10 | | (1/8)*1/10 | (1/8)*2/10 | (1/8)*3/10 | (1/8)*4/10 | (1/8)*5/10 | (1/8)*6/10 | (1/8)*7/10 | 0.35 |
| Loop 11 | | | (1/8)*1/10 | (1/8)*2/10 | (1/8)*3/10 | (1/8)*4/10 | (1/8)*5/10 | (1/8)*6/10 | 0.2625 |
| Loop 12 | | | | (1/8)*1/10 | (1/8)*2/10 | (1/8)*3/10 | (1/8)*4/10 | (1/8)*5/10 | 0.1875 |
| Loop 13 | | | | | (1/8)*1/10 | (1/8)*2/10 | (1/8)*3/10 | (1/8)*4/10 | 0.125 |
| Loop 14 | | | | | | (1/8)*1/10 | (1/8)*2/10 | (1/8)*3/10 | 0.075 |
| Loop 15 | | | | | | | (1/8)*1/10 | (1/8)*2/10 | 0.0375 |
| Loop 16 | | | | | | | | (1/8)*1/10 | 0.0125 |
| | | | | | | | | Average | 0.46484375 |

FIG. 15A

Rate at which bit lines become "0" (present invention)

| 2: Write Level | 0 | 1 | 2 | 3 | 4 | 5 | 6 | 7 | |
|---|---|---|---|---|---|---|---|---|---|
| Loop 1 | | (1/8)*10/10 | | | | | | | 0.125 |
| Loop 2 | | (1/8)*9/10 | (1/8)*10/10 | | | | | | 0.2375 |
| Loop 3 | | (1/8)*8/10 | (1/8)*9/10 | (1/8)*10/10 | | | | | 0.3375 |
| Loop 4 | | (1/8)*7/10 | (1/8)*8/10 | (1/8)*9/10 | (1/8)*10/10 | | | | 0.425 |
| Loop 5 | | (1/8)*6/10 | (1/8)*7/10 | (1/8)*8/10 | (1/8)*9/10 | (1/8)*10/10 | | | 0.5 |
| Loop 6 | | (1/8)*5/10 | (1/8)*6/10 | (1/8)*7/10 | (1/8)*8/10 | (1/8)*9/10 | (1/8)*10/10 | | 0.5625 |
| Loop 7 | | (1/8)*4/10 | (1/8)*5/10 | (1/8)*6/10 | (1/8)*7/10 | (1/8)*8/10 | (1/8)*9/10 | (1/8)*10/10 | 0.6125 |
| Loop 8 | | (1/8)*3/10 | (1/8)*4/10 | (1/8)*5/10 | (1/8)*6/10 | (1/8)*7/10 | (1/8)*8/10 | (1/8)*9/10 | 0.525 |
| Loop 9 | | (1/8)*2/10 | (1/8)*3/10 | (1/8)*4/10 | (1/8)*5/10 | (1/8)*6/10 | (1/8)*7/10 | (1/8)*8/10 | 0.4375 |
| Loop 10 | | (1/8)*1/10 | (1/8)*2/10 | (1/8)*3/10 | (1/8)*4/10 | (1/8)*5/10 | (1/8)*6/10 | (1/8)*7/10 | 0.35 |
| Loop 11 | | | (1/8)*1/10 | (1/8)*2/10 | (1/8)*3/10 | (1/8)*4/10 | (1/8)*5/10 | (1/8)*6/10 | 0.2625 |
| Loop 12 | | | | (1/8)*1/10 | (1/8)*2/10 | (1/8)*3/10 | (1/8)*4/10 | (1/8)*5/10 | 0.1875 |
| Loop 13 | | | | | (1/8)*1/10 | (1/8)*2/10 | (1/8)*3/10 | (1/8)*4/10 | 0.125 |
| Loop 14 | | | | | | (1/8)*1/10 | (1/8)*2/10 | (1/8)*3/10 | 0.075 |
| Loop 15 | | | | | | | (1/8)*1/10 | (1/8)*2/10 | 0.0375 |
| Loop 16 | | | | | | | | (1/8)*1/10 | 0.0125 |
| | | | | | | | | Average | 0.30078125 |

FIG. 15B

| Verify Level | 1 | 2 | 3 | 4 | 5 | 6 | 7 | |
|---|---|---|---|---|---|---|---|---|
| REGA | L | H | L | H | L | H | L | |
| REGB | H | L | L | H | H | L | L | |
| REGS | H | H | H | L | L | L | L | |

FIG. 17

Rate at which bit lines become "0" (present invention)

| Write Level | 0 | 1 | 2 | 3 | 4 | 5 | 6 | 7 | |
|---|---|---|---|---|---|---|---|---|---|
| Loop 1 | | (1/8)*10/10 | (1/8)*10/10 | (1/8)*10/10 | (1/8)*10/10 | (1/8)*10/10 | | | 0.625 |
| Loop 2 | | (1/8)*9/10 | (1/8)*10/10 | (1/8)*10/10 | (1/8)*10/10 | (1/8)*10/10 | | | 0.6125 |
| Loop 3 | | (1/8)*8/10 | (1/8)*9/10 | (1/8)*10/10 | (1/8)*10/10 | (1/8)*10/10 | | | 0.5875 |
| Loop 4 | | (1/8)*7/10 | (1/8)*8/10 | (1/8)*9/10 | (1/8)*10/10 | (1/8)*10/10 | | | 0.55 |
| Loop 5 | | (1/8)*6/10 | (1/8)*7/10 | (1/8)*8/10 | (1/8)*9/10 | (1/8)*10/10 | | | 0.5 |
| Loop 6 | | (1/8)*5/10 | (1/8)*6/10 | (1/8)*7/10 | (1/8)*8/10 | (1/8)*9/10 | (1/8)*10/10 | | 0.5625 |
| Loop 7 | | (1/8)*4/10 | (1/8)*5/10 | (1/8)*6/10 | (1/8)*7/10 | (1/8)*8/10 | (1/8)*9/10 | (1/8)*10/10 | 0.6125 |
| Loop 8 | | (1/8)*3/10 | (1/8)*4/10 | (1/8)*5/10 | (1/8)*6/10 | (1/8)*7/10 | (1/8)*10/10 | (1/8)*10/10 | 0.6 |
| Loop 9 | | (1/8)*2/10 | (1/8)*3/10 | (1/8)*4/10 | (1/8)*5/10 | (1/8)*10/10 | (1/8)*10/10 | (1/8)*10/10 | 0.6125 |
| Loop 10 | | (1/8)*1/10 | (1/8)*2/10 | (1/8)*3/10 | (1/8)*4/10 | (1/8)*10/10 | (1/8)*10/10 | (1/8)*10/10 | 0.575 |
| Loop 11 | | | (1/8)*1/10 | (1/8)*2/10 | (1/8)*3/10 | (1/8)*10/10 | (1/8)*10/10 | (1/8)*10/10 | 0.5375 |
| Loop 12 | | | | (1/8)*1/10 | (1/8)*10/10 | (1/8)*10/10 | (1/8)*10/10 | (1/8)*10/10 | 0.625 |
| Loop 13 | | | | | (1/8)*10/10 | (1/8)*10/10 | (1/8)*10/10 | (1/8)*10/10 | 0.625 |
| Loop 14 | | | | | (1/8)*10/10 | (1/8)*10/10 | (1/8)*10/10 | (1/8)*10/10 | 0.625 |
| Loop 15 | | | | | (1/8)*10/10 | (1/8)*10/10 | (1/8)*10/10 | (1/8)*10/10 | 0.625 |
| Loop 16 | | | | | (1/8)*10/10 | (1/8)*10/10 | (1/8)*10/10 | (1/8)*10/10 | 0.625 |

Average 0.59375

FIG. 18

SEMICONDUCTOR MEMORY DEVICE CAPABLE OF SUPPRESSING PEAK CURRENT

CROSS-REFERENCE TO RELATED APPLICATIONS

This application is a continuation of U.S. application Ser. No. 12/179,076 filed Jul. 24, 2008, and is based upon and claims the benefit of priority from prior Japanese Patent Application No. 2007-199947, filed Jul. 31, 2007, the entire contents of each of which are incorporated herein by reference.

BACKGROUND OF THE INVENTION

1. Field of the Invention

The present invention relates to, for example, a NAND flash memory and, more particularly, to a semiconductor memory device in which multilevel data can be stored in a memory cell.

2. Description of the Related Art

In a NAND flash memory, a plurality of cells arranged in a column direction are connected in series so as to constitute NAND cells, and the drain side of each of the NAND cells is connected to a bit line through a selector gate. Each bit line is connected to a latch circuit for writing and a latch circuit for reading. A data write operation or a data read operation is collectively performed with respect to all the cells or half the cells (for example, cells of 2 to 4 kB) arranged in the row direction.

Further, in an erase operation, a threshold voltage of the memory cell is set at a negative value, and electrons are injected into the memory cell by a write operation, whereby the threshold voltage is set at a positive value. However, in the NAND cells, a plurality of memory cells are connected in series. Thus, at the time of a read operation, unselected cells must be set in an on-state. Accordingly, a read voltage (Vread) higher than the threshold voltage is applied to the gate of the memory cell. On the other hand, in the write operation, the threshold voltage to be written to the memory cell must not exceed Vread. For this reason, in the write operation, program, and program/verify/read are repeatedly performed for each bit, and the threshold voltage is controlled such that the threshold voltage does not exceed Vread.

Further, recently, an increase in the memory capacity has rapidly been advanced, and a multilevel memory in which data of two bits or more is stored in a cell has been developed. For example, when two-bit data is stored in a cell, four threshold voltages must be set, and it is necessary to make the distribution of the threshold voltage per one threshold voltage narrower than a memory in which one-bit data is stored in a cell. This write operation is performed with high accuracy, and hence there is a problem that the write speed becomes low.

On the other hand, when the voltage level of Vread is raised, a high Vread is applied to the cell at the read time. Thus, there arises a problem that a miswrite occurs. Further, when it is tried to write a high level to the memory cell, a high write voltage is required. When data is collectively written to all the cells or half the cells arranged in the row direction, a high voltage is applied to a gate of a cell in a non-written state depending on the data. Thus, there is a problem that a miswrite occurs. Accordingly, within a limited range of the threshold voltage, for example, −2 V to 5 V, four threshold voltages must be set in the case of four values, eight threshold voltages must be set in the case of eight values, and sixteen threshold voltages must be set in the case of sixteen values. In order to set such threshold voltages, many program operations and verify operation must be repeated, and the write time is increased.

Thus, in order to enhance the write performance, the number of cells to which data is written at a time is increased. However, at the beginning of the program operation, all the bit lines must be charged. Further, it is also necessary to charge all the bit lines or determine a cell of a large current at the beginning of the verify/read operation. When the number of cells to which data is written at a time is increased, the number of bit lines to be charged simultaneously is also increased. Thus, in the early stage of the program operation or the verify/read operation, a very large current is required, and hence a peak current occurs. Particularly, depending on the pattern of the write data, a large peak current occurs.

Heretofore, a technique for reducing a peak current at the write time or the verify time has been developed (see, for example, Jpn. Pat. Appln. KOKAI Publication No. 2000-163976 or Jpn. Pat. Appln. KOKAI Publication No. 2000-276887). However, it is demanded to securely suppress the peak current regardless of the pattern of the write data.

BRIEF SUMMARY OF THE INVENTION

According to a first aspect of the invention, there is provided a semiconductor memory device comprising: a memory cell array including a plurality of memory cells, in which n (n is a natural number equal to 2 or larger) cells are simultaneously written; a control circuit for controlling the memory cell array; and a conversion circuit configured to convert data constituted of k (a natural number equal to 2 or larger) bits stored in the n memory cells into data of h (h is equal to k or larger, and is a natural number equal to 2 or larger) bits on the basis of a conversion rule, the converted data being stored in the n memory cells.

According to a second aspect of the invention, there is provided a semiconductor memory device comprising: a plurality of memory cells, in which a plurality of data are stored at i levels of level "0", and level "1" to level "(i−1)" (i is a natural number equal to 1 or larger); and a control section configured to simultaneously write data to n (n is a natural number equal to 1 or larger) cells of the plural memory cells, wherein when the n memory cells are written, the control section performs a write operation and a write verify operation, when, in the write verify operation, m (m≦n) cells to be simultaneously written are not yet written, the control section repeats the write operation and the write verify operation again, and writes only write cells at lower levels at the beginning of the repeated operations.

According to a third aspect of the invention, there is provided a semiconductor memory device comprising: a plurality of memory cells, in which a plurality of data are stored at i levels of level "0", and level "1" to level "(i−1)" (i is a natural number equal to 1 or larger); and a control section configured to simultaneously write data to n (n is a natural number equal to 1 or larger) cells of the plural memory cells, wherein when the n memory cells are written, the control section performs a write operation and a write verify operation, when, in the write verify operation, m (m≦n) cells to be simultaneously written are not yet written, the control section repeats the write operation and the write verify operation again, and at the time of the write verify, the control section charges only bit lines connected to cells which are the object of the write verify.

According to a fourth aspect of the invention, there is provided a semiconductor memory device comprising:

memory cells; bit lines connected to the memory cells; data storage circuits connected to the bit lines, the data storage circuits each holding a first logical level and a second logical level; and a control circuit configured to control the bit lines and the data storage circuits, wherein in a write operation, when data of the data storage circuit is at the first logical level, the control circuit performs a write operation, and when the data of the data storage circuit is at the second logical level, the control circuit sets non-write, in a write verify operation, when the data of the data storage circuit is at the first logical level, the control circuit charges the bit lines, and when the data of the data storage circuit is at the second logical level, the control circuit does not charge the bit lines, and in the write verify operation, when a threshold level of the memory cell reaches a predetermined threshold level, the control circuit changes the logical level of the data storage circuit from the first logical level to the second logical level.

BRIEF DESCRIPTION OF THE SEVERAL VIEWS OF THE DRAWING

FIG. 2 is a view showing a schematic configuration of a NAND flash memory.

FIG. 4 is a circuit diagram showing another configuration example of each of the memory cell array and the bit line control circuit shown in FIG. 2.

FIGS. 5A and 5B are cross-sectional views showing a memory cell and a select transistor.

FIG. 7 is a table showing examples of voltages supplied to the areas shown in FIG. 6.

FIG. 8 is a circuit diagram showing an example of a data storage circuit shown in FIG. 3.

FIG. 9 is a view showing a relationship between the write data and the memory cell data.

FIGS. 12A and 12B are views showing examples of a case where redundant cell data is added.

FIGS. 14A, 14B, and 14C are views each showing a data cache operation.

FIGS. 15A and 15B are views each showing a rate at which a bit line becomes "0" at the write time.

FIG. 17 is a table showing levels of signals supplied to the data storage circuit.

FIG. 18 is a table showing an example in which a dummy load is applied at the write time.

DETAILED DESCRIPTION OF THE INVENTION

Figures 1A, 1B:
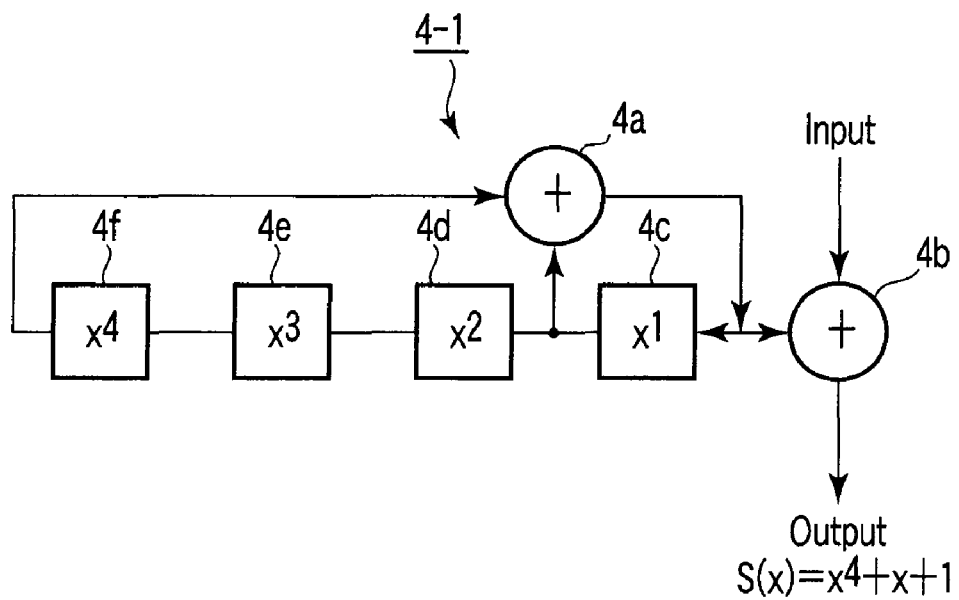
FIG. 1A is a circuit diagram showing an example of a conversion circuit for randomizing data according to an embodiment.
FIG. 1B is a view showing an operation of FIG. 1A.

First, an outline of this embodiment will be described below. In a NAND flash memory, data is simultaneously written to cells of 2 to 4 kB, and data is simultaneously read from the cells. At the time of a write operation, in a case of a write data pattern in which bit lines are alternately charged one by one by VDD and Vss, the capacity of the bit line becomes large, a large peak current is liable to occur. Therefore, the write data pattern is randomized in such a manner that the data pattern does not become a data pattern in which the bit lines are alternately charged one by one by VDD and Vss. As the randomizing method, for example, a randomization system using an N series is employed. As the randomizing form, a page address and a block address are used. As a result of this, data in the NAND cells is randomized, and hence it is possible to avoid a data pattern which generates a miswrite.

Further, in the case of, for example, eight-valued data, data is written to seven threshold levels. By randomizing data written to the eight-valued levels, the threshold levels are made uniform.

In the early stage of the write sequence, in the higher levels, the write voltage is low, and hence write completion is not obtained. Accordingly, the level of the bit lines is set in such a manner that the capacity of all the bit lines becomes small. For example, when data is simultaneously written to half the cells arranged in the row direction, a non-write bit line is at VDD, and hence by also setting bit lines of write cells for the higher level at VDD, the capacity is made small. Further, when the writing is advanced, the number of cells to which data has already been written is increased. Thus, the bit lines are made non-select, i.e., the bit lines are set at VDD, and hence the capacity of the bit lines is reduced.

Further, as for write/verify, bit lines which are the object to be verified need not be charged, and by charging only the bit lines which are the object to be verified, the number of cells of bit lines to be charged can be made small, and the current consumption at the verify time can be reduced.

An embodiment of the present invention will be described below with reference to the accompanying drawings.

First Embodiment

FIG. 2 shows the schematic configuration of a NAND flash memory for storing eight-valued data of three bits.

A memory cell array 1 includes a plurality of bit lines, a plurality of word lines, and common source lines, and in which electrically rewritable memory cells constituted of, for example, EEPROM cells are arranged in a matrix form. A bit line control circuit 2 for controlling bit lines, and a word line control circuit 6 are connected to the memory cell array 1.

In the bit line control circuit 2, by reading data of a memory cell in the memory cell array 1 through a bit line, by detecting a state of the memory cell in the memory cell array 1 through the bit line, or by applying a write control voltage to the memory cell in the memory cell array 1 through the bit line, data is written to the memory cell. A column decoder 3, and a data input/output buffer 4 are connected to the bit line control circuit 2. A data storage circuit included in the bit line control circuit 2 is selected by the column decoder 3. Data of the memory cell read by the data storage circuit is output to the outside from a data input/output terminal 5 through the data input/output buffer 4. The data input/output terminal 5 is connected to a controller 11 outside the memory chip. This controller 11 receives data output from the data input/output terminal 5. Further, the controller 11 receives a command, address data, and data supplied from, for example, a host (not shown), and outputs various control signals for controlling an operation of the NAND flash memory, an address signal ADD, and data DT. The write data input to the input/output terminal 5 from the controller 11 is supplied to a data storage circuit selected by the column decoder 3 through the data input/output buffer 4, and the command and address input to the terminal 5 are supplied to a control signal and control voltage generation circuit 7.

The word line control circuit 6 is connected to the memory cell array 1. This word line control circuit 6 selects a word line in the memory cell array 1, and applies a voltage necessary for read, write or erase to the selected word line.

The memory cell array 1, bit line control circuit 2, column decoder 3, data input/output buffer, and word line control circuit 6 are connected to the control signal and control voltage generation circuit 7, and are controlled by the circuit 7. The control signal and control voltage generation circuit 7 is connected to a control signal input terminal 8, and is controlled by control signals address latch enable (ALE), command latch enable (CLE), and write enable (WE) which are input from the controller 11 through the control signal input terminal 8.

The bit line control circuit 2, column decoder 3, word line control circuit 6, and control signal and control voltage generation circuit 7 constitute a write circuit and a read circuit.

Further, the control signal and control voltage generation circuit 7 includes a dynamic data cache (DDC) control circuit 7-1. This DDC control circuit 7-1 generates a control signal for controlling a refresh operation of a plurality of DRAMs serving as a dynamic latch circuit included in the data storage circuit, to be described later.

Figure 3:
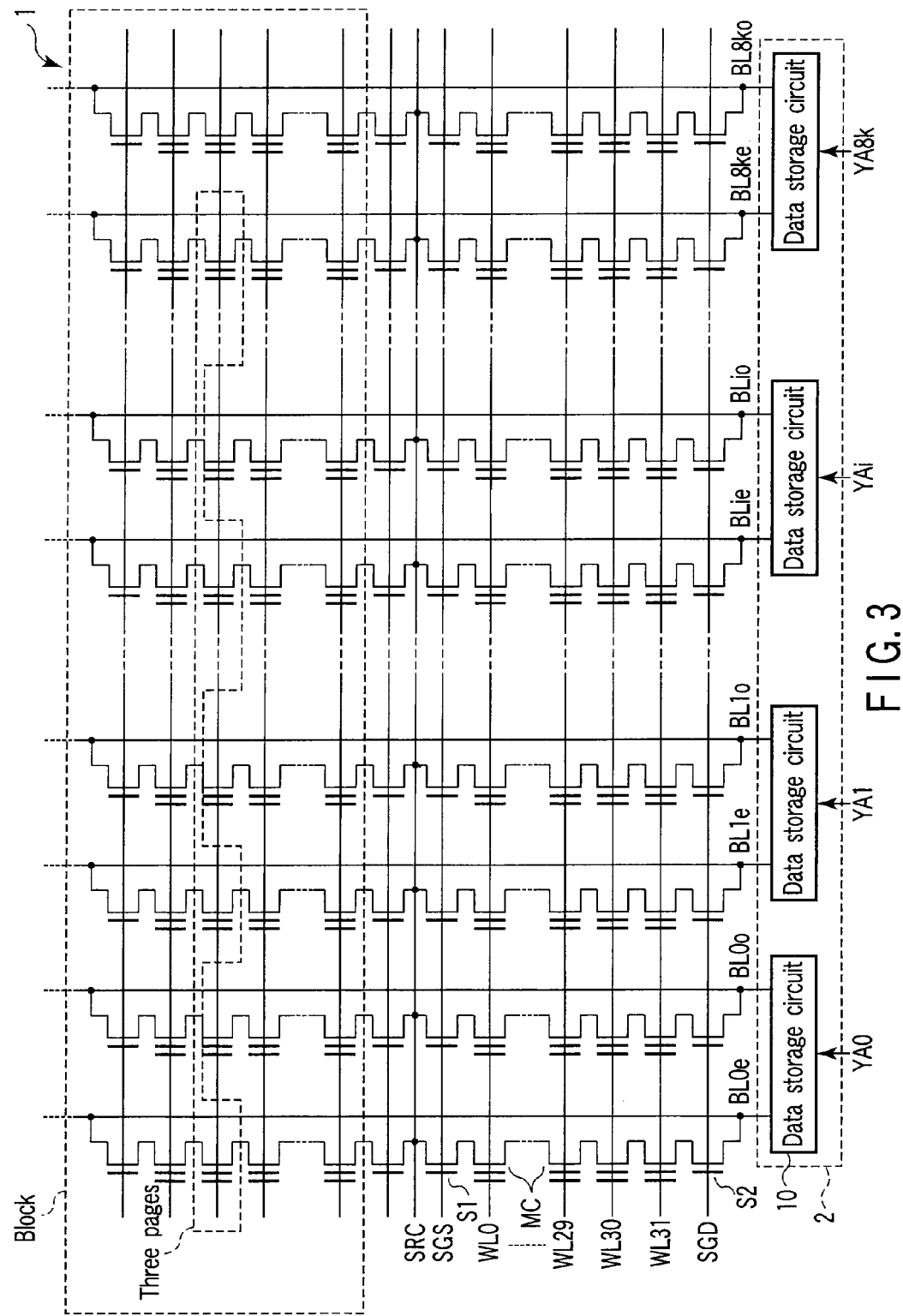
FIG. 3 is a circuit diagram showing a configuration example of each of a memory cell array and a bit line control circuit shown in FIG. 2.

FIG. 3 shows a configuration example of each of the memory cell array 1 and the bit line control circuit 2 shown in FIG. 2. In the memory cell array 1, a plurality of NAND cells are arranged. One NAND cell is constituted of a memory cell MC comprising, for example, thirty-two EEPROMs connected in series, and select gates S1 and S2. The select gate S2 is connected to a bit line BL0$e$, and the select gate S1 is connected to a source line SRC. A control gate of the memory cell MC arranged in each row is connected to word lines WL0 to WL29, WL30, and WL31 as a common connection. Further, the select gate S2 is connected to a select line SGD as a common connection, and the select gate S1 is connected to a select line SGS as a common connection.

The bit line control circuit 2 includes a plurality of data storage circuits 10. Each pair of bit lines (BL0$e$, BL0$o$), (BL1$e$, BL2$o$) ... (Bli$e$, Bli$o$), and (BL8$ke$, BL8$ko$) is connected to a corresponding one of the data storage circuits 10.

The memory cell array 1 includes a plurality of blocks as indicated by a broken line. Each block is constituted of a plurality of NAND cells. Data is erased, for example, in units of the blocks. Further, an erase operation is performed simultaneously with respect to the two bit lines connected to the data storage circuit 10.

Further, a plurality of memory cells (memory cells surrounded by a broken line) each of which is arranged on every other bit line, and is connected to a word line, constitute one sector. Data is written or read in units of the sectors. That is, half the memory cells arranged in the row direction are connected to the corresponding bit lines. Accordingly, a write operation or a read operation is executed with respect to half the memory cells arranged in the row direction.

In read, program verify, and program operations, one of the two bit lines (BLi$e$, Bli$o$) connected to the data storage circuit 10 is selected in accordance with address signals (YA0, YA1 ... Yai ... YA8$k$) supplied from outside. Further, in accordance with an external address, one word line is selected, and a third page, indicated by the broken line, is selected. The changeover to the third page is performed according to the address.

FIG. 4 shows another configuration example of each of the memory cell array 1 and the bit line control circuit 2 shown in FIG. 2. In the case of the configuration shown in FIG. 3, the two bit lines (Bli$e$, Bli$o$) are connected to the data storage circuit 10. Conversely, in the case of the configuration shown in FIG. 4, a data storage circuit 10 is connected to each bit line, and memory cells arranged in the row direction are all connected to the corresponding bit line. Thus, a write or read operation can be performed with respect to all the memory cells arranged in the row direction.

Incidentally, both the configurations shown in FIGS. 3 and 4 are applicable to the following description. Here, a case where the configuration shown in FIG. 3 is used will be described below.

FIGS. 5A and 5B show cross-sectional views of a memory cell and a select transistor. FIG. 5A shows a memory cell. An n type diffusion layer 42, serving as a source and a drain of the memory cell, is formed in a substrate 51 (p type well region 55 to be described later). A floating gate (FG) 44 is formed on the p type well region 55 through a gate insulating film 43, and a control gate (CG) 46 is formed on the floating gate 44 through an insulating film 45. FIG. 5B shows a select gate. In the p type well region 55, an n type diffusion layer 47 serving as a source and drain is formed. A control gate 49 is formed on the p type well region 55 through a gate insulating film 48.

Figure 6:
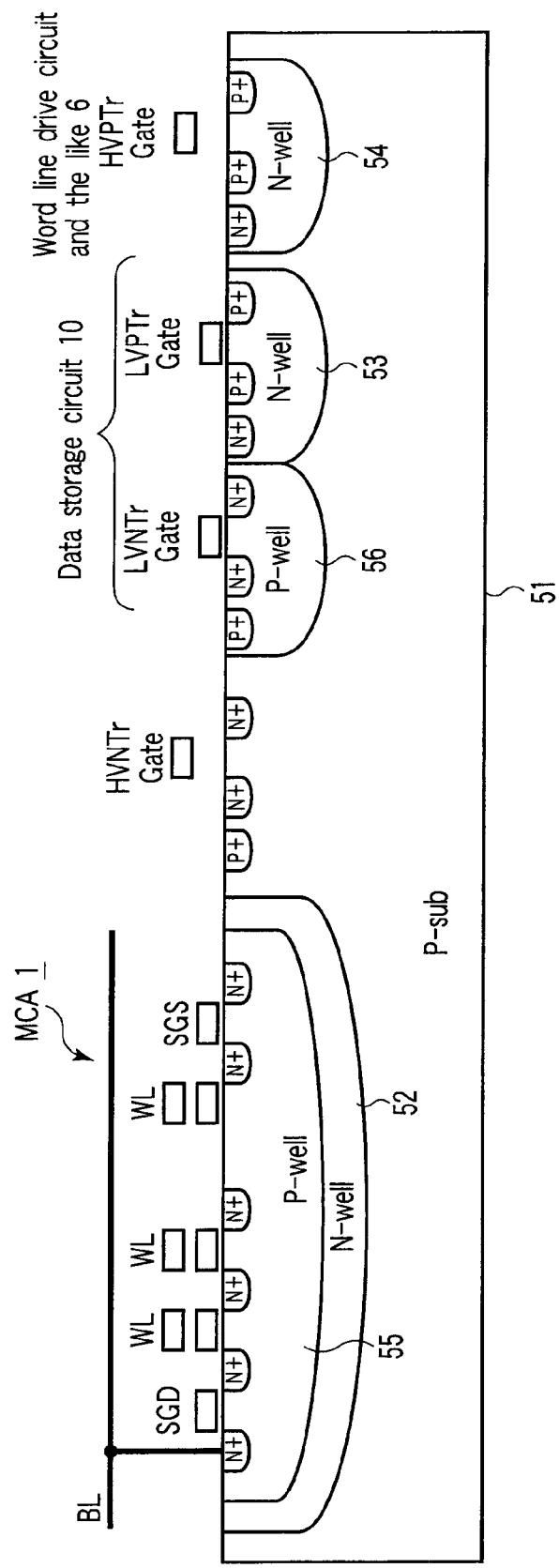
FIG. 6 is a cross-sectional view showing a NAND flash memory.

FIG. 6 shows across-sectional view of a NAND flash memory. For example, in a p type semiconductor substrate 51, n type well regions 52, 53, 54, and a p type well region 56 are formed. The p type well region 55 is formed in the n type well region 52. A low-voltage n-channel transistor LVNTr constituting the memory cell array 1 is formed in the p type well region 55. Further, a low-voltage p-channel transistor LVPTr, and a low-voltage n-channel transistor constituting the data storage circuit 10 are formed in the n type well region 53, and the p type well region 56, respectively. A high-voltage n-channel transistor HVNTr connecting the bit line and the data storage circuit 10 to each other is formed in the substrate 51. Further, a high-voltage p-channel transistor HVPTr constituting, for example, a word line drive circuit is formed in the n type well region 54. As shown in FIG. 5, the high-voltage transistors HVNTr, and HVPTr include, for example, a gate insulating film thicker than the low-voltage transistors LVNTr, and LVPTr.

FIG. 7 shows examples of voltages supplied to the regions shown in FIG. 6. In erase, program, and read operations, voltages shown in FIG. 7 are supplied to the regions shown in FIG. 6. In FIG. 7, Vera is a voltage applied to the substrate when data is erased. Vss is a ground voltage, Vdd is a power supply voltage, Vpgm is a voltage supplied to the word line when data is written, Vpgmh is a voltage for transferring Vpgm, and Vpgmh=Vpgm+Vth. When data is read, Vss is supplied to a well in which a memory cell is formed. Vread is a voltage supplied to the word line when data is read. Vreadh is a voltage for transferring Vread, and Vreadh=Vread+Vth.

FIG. 8 is a circuit diagram showing an example of the data storage circuit 10 shown in FIG. 3.

The data storage circuit 10 shows a case where eight-valued data of three bits is written or read, and includes a primary data cache (PDC), secondary data cache (SDC), dynamic data cache (DDCA, DDCB, DDCQ), and temporary data cache (TDC). The SDC, PDC, DDCA, DDCB, and DDCQ hold input data when data is written, hold read data when data is read, and temporarily hold data when data is verified. Furthermore, these caches are used to manipulate internal data when multivalued data is stored. The TDC amplifies data of the bit line when data is read, temporarily holds the data, and is used to manipulate internal data when multivalued data is stored.

The SDC is constituted of clocked inverter circuits 61a and 61b constituting a static latch circuit, and transistors 61c and 61d. The transistor 61c is connected to an input terminal of the clocked inverter circuit 61a, and an input terminal of the clocked inverter circuit 61b at both ends thereof. A signal EQ2 is supplied to a gate of the transistor 61c. The transistor 61d is connected to an output terminal of the clocked inverter circuit 61b and the ground at both ends thereof. A signal PRST is supplied to a gate of the transistor 61d. A node N2a of the SDC is connected to an input/output data line IOn through a column select transistor 61e, and a node N2b of the SDC is connected to an input/output data line IO through a column select transistor 61f. A column select signal CSLi is supplied to each gate of these transistors 61e and 61f. The node N2a of the SDC is connected to a node N1a of the PDC through transistors 61g and 61h. A signal BLC2 is supplied to a gate of the transistor 61g, and a signal BLC1 is supplied to a gate of the transistor 61h.

The PDC is constituted of clocked inverter circuits 61i and 61j constituting a static latch circuit, and a transistor 61k. The transistor 61k is connected to an input terminal of the clocked inverter circuit 61i, and an input terminal of the clocked inverter circuit 61j at both ends thereof. A signal EQ1 is supplied to a gate of the transistor 61k. A node N1b of the PDC is connected to a gate of a transistor 61l. One end of a current path of the transistor 61l is grounded through a transistor 61m. A signal CHK1 is supplied to a gate of the transistor 61m. Further, the other end of the current path of the transistor 61ll is connected to one end of a current path of transistors 61n and 61o constituting a transfer gate. A signal CHK2n is supplied to a gate of the transistor 61n. Further, a gate of the transistor 61o is connected to a node N2a. The other end of the current path of the transistors 61n and 61o is connected to a signal line COMi. The signal line COMi is connected to all the data storage circuits 10 as a common connection, and it is possible to judge whether or not verify is completed with respect to all the data storage circuits 10 on the basis of the level of the signal line COMi. That is, as will be described later, when verify is completed, a node N1b of the PDC goes to the low level (node N1a goes to the high level). In this state, when the signals CHK1 and CHK2n are made to go to the high level, when verify is completed, the signal line COMi goes to the high level.

Further, the TDC is constituted of, for example, a MOS capacitor 61p. The capacitor 61p is connected to a connection node N3 of the transistors 61g and 61h at one end thereof, and the other end thereof is supplied with a signal BOOST to be described later. Further, the DDCA, DDCB, and DDCQ are connected to the connection node N3 through transistors 61qA to 61qC. Signals REGA to REGQ are supplied to gates of the transistors 61qA to 61qC, respectively.

The DDCA, DDCB, and DDCQ each constituting a dynamic latch circuit are constituted of transistors 61rA to 61rC, respectively. A signal VPRE is supplied to one end of a current path of each of the transistors 61rA to 61rC, and the other end thereof is connected to a current path of each of the transistors 61qA to 61qC. A gate of each of the transistors 61rA to 61rC is connected to the node N1a of the PDC through each of the transistors 61sA to 61sC. Signals DTGA, DTGB, and DTGQ are supplied to gates of the transistors 61sA to 61sC, respectively.

Further, one end of a current path of each of transistors 61t and 61u is connected to the connection node N3. A signal VPRE is supplied to the other end of the current path of the transistor 61u, and a signal BLPRE is supplied to a gate thereof. A signal BLCLAMP is supplied to a gate of the transistor 61t. The other end of the current path of the transistor 61t is connected to one end of the bit line Blo through a transistor 61v, and is connected to one end of the bit line Ble through a transistor 61w. The one end of the bit line Blo is connected to one end of a current path of a transistor 61x. A signal BIASo is supplied to a gate of the transistor 61x. The one end of the bit line Ble is connected to one end of a current path of a transistor 61y. A signal BIASe is supplied to a gate of the transistor 61y. A signal BLCRL is supplied to the other end of a current path of each of the transistors 61x and 61y. The transistors 61x and 61y are turned on complementarily to the transistors 61v and 61w in accordance with the signals BIASo and BIASe to supply the potential of the signal BLCRL to an unselected bit line.

Incidentally, transistors 62a and 62b are connected in series between the node N3 and the potential VPRE. A signal REGS is supplied to a gate of the transistor 62a, and a gate of the transistor 62b is connected to the node N2a of the SDC. Hereinafter, it is defined that the data of the PDC is the potential of the node N1a, the data of the SDC is the potential of the node N2a, and the data of the TDC is the potential of the node N3. It is also defined that the data of each of the DDCA, DDCB, and DDCQ is the potential of the gate of each of the transistors 61rA to 61rC.

The signals and voltages described above are generated by the control signal and control voltage generation circuit 7 shown in FIG. 2, and operations of data write, verify, and read are controlled on the basis of the control performed by the control signal and control voltage generation circuit 7. Further, the DDCA, DDCB, and DDCQ are refreshed by a control signal generated by the DDC control circuit 7-1. As this refreshing operation is not within the gist of this embodiment, a description thereof is omitted.

Since this memory is a multivalued memory, data of two bits or more can be stored in one cell, and changeover to two-bit storage is performed according to the address. When two bits are stored in one cell, a changeover to two-bit storage is made according to the address (first page, second page). When three bits are stored in one cell, a changeover to three-bit storage is made according to the address (first page, second page, third page). When four bits are stored in one cell, a changeover to four-bit storage is made according to the address (first page, second page, third page, fourth page).

(Erase Operation)

An erase operation is made in units of blocks indicated by the broken line in FIG. 3 or 4. After the erase operation is performed, the threshold voltage of the cell becomes the data "0" of the memory cell.

FIG. 9 shows a relationship between data of a memory cell and a threshold voltage of a memory cell, and a relationship between data of a memory cell and data of each page. A case of eight values where data of three bits is stored in one cell will be described below. When the erase operation is performed as described above, data of the memory cell becomes "0". The data of the memory cell becomes any one of "0" to "7" by the write operation.

(Read Operation)

As shown in FIG. 9, data of the memory cell is any one of "0" to "7", and hence it is sufficient when the read operation is performed at one of the levels "a" to "g".

(Read)

Figure 10:
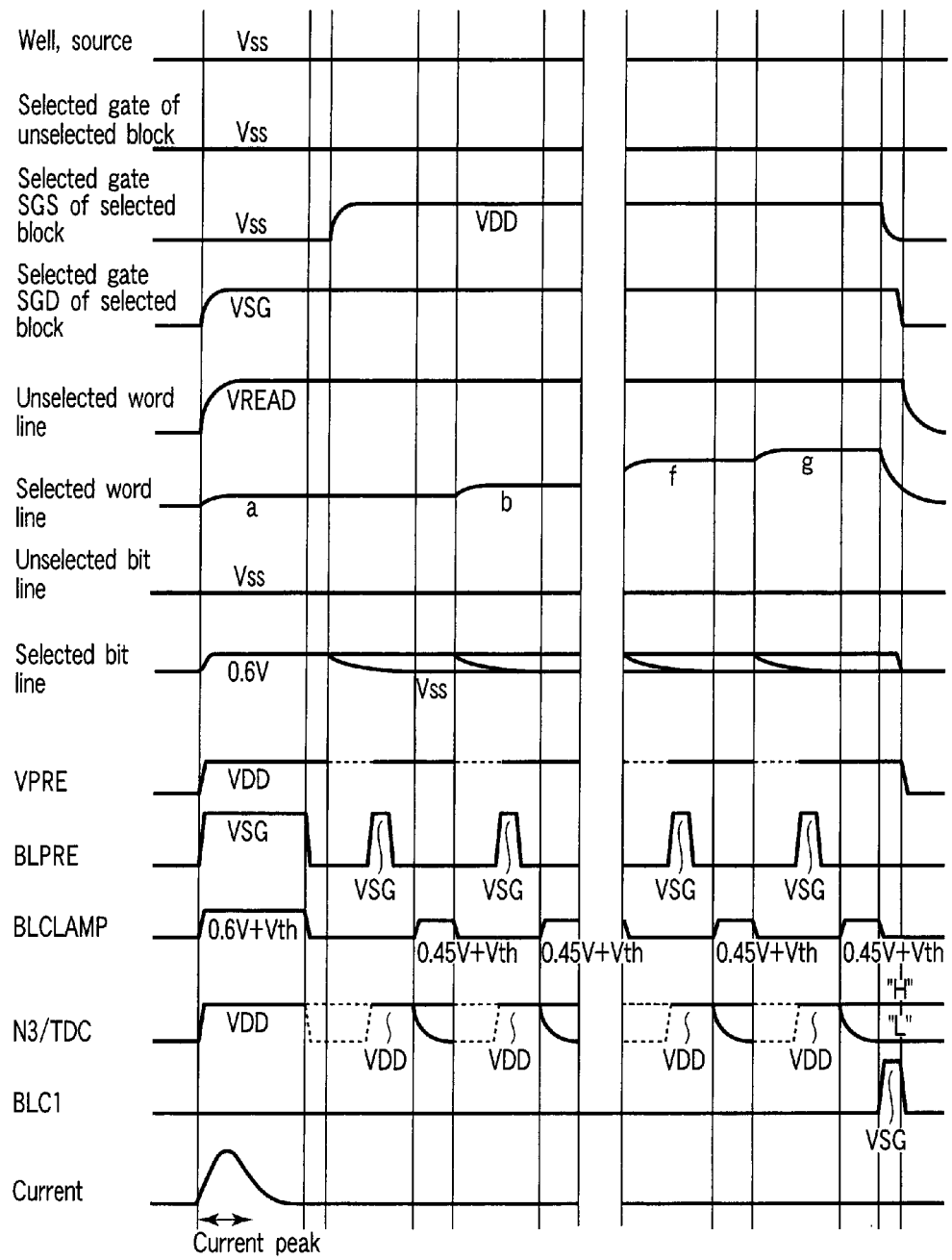
FIG. 10 is a view showing a read operation and a verify/read operation.

FIG. 10 shows waveforms of read and verify read operations. First, a well, source line, and unselected bit line of the selected cell are set at Vss (0 V).

A potential "a" (for example, "a"=0 V) of the read operation is supplied to a selected word line. Simultaneously with this, Vread is supplied to an unselected word line of a selected block, Vsg (Vdd+Vth) is supplied to a selected line SGD of the selected block, and Vss is supplied to the select line SGS. The signal VPRE of the data storage circuit shown in FIG. 8 is set at Vdd (for example, 2.5 V), the signal BLPRE is set at Vsg (Vdd+Vth is supplied to PDC), and the signal BLCLAMP is temporarily set at, for example, (0.6 V+Vth), thereby pre-charging the bit line to, for example, 0.6 V.

At this time, the selected bit line is 0.6 V, and the unselected bit line is Vss, and hence when the capacitance of a certain selected bit line, unselected bit line, well and source, and the like is, for example, 4 pF, the capacitance Q of one bit line is obtained from the following equation Q (one bit line)=C (4 pF)×V (0.6 V). For example, when 8 kB is simultaneously written, the capacitance Q is obtained from the following equation Q (8 kB)=8×1024×8×C (4 pF)×V (0.6 V). Thus, a very large peak current is generated.

Then, the select line SGS on the source side of the cell is set at Vsg (Vdd+Vth). When the threshold voltage is higher than "a" (for example, "a"=0 V), the cell is turned off, and hence the bit line is kept at the high level (hereinafter referred to as "H")(for example, 0.6 V). Further, when the threshold voltage is lower than "a", the cell is turned on, and hence the bit line is discharged to have the same potential as the source, i.e., Vss.

The signal BLPRE of the data storage circuit shown in FIG. 8 is temporarily set at Vsg (Vdd+Vth) to pre-charge the node of the TDC to Vdd. Thereafter, the signal BLCLAMP is set at, for example, a voltage of (0.45 V+Vth). When the bit line is lower than 0.45 V, the node of the TDC goes to the low level (hereinafter referred to as "L"). When the bit line is higher than 0.45 V, the node of the TDC is kept at "H". Here, the signal BLC1 is set at Vsg (Vdd+Vth), and the PDC reads the potential of the TDC. When the threshold voltage of the cell is lower than the level "a", the PDC goes to "L". When the threshold voltage is higher than the level "a", the PDC goes to "H", and hence a read operation is performed.

Then, the potential "b" of reading is supplied to the selected word line. When the threshold voltage is higher than the level "b", the cell is turned off, and hence the bit line is kept at "H" (for example, 0.6 V). When the threshold voltage is lower than the level "b", the cell is turned on, and hence the bit line is discharged to have the same potential as the source, i.e., Vss. In the manner described above, the voltage of the word line is successively changed, and the read data is stored in the PDC and SDC.

As shown in FIG. 4, when data of all the cells arranged in the row direction is collectively read, when the select line SGS of the selected block is made "H" simultaneously with the select line SGD of the selected block, and the bit line is charged, and at the same time, the bit line is in a charged state, and when the bit line is discharged, and the cell is in an off-state, the bit line is brought into a charged state. The TDC shown in FIG. 8 reads the level of the bit line, and the level of the TDC is transferred to the PDC. When the number of cells in the on-state is large, a large current flows from the node to which the signal VPRE is supplied to the source. For this reason, there is a problem that the potential of the source is floated. In order to prevent this, plural read operations are performed, and a result of reading a cell that is turned on first at this time, i.e., a cell through which a current flows even when the source is floated is made "L". The bit line to which the above cell is connected is not charged next time, and subsequently, a cell a read result of which is "H" at the first reading is read again. Accordingly, in the second reading, a cell a cell current of which is large is not read, and hence the source is not floated, thereby enabling accurate reading.

(Program and Program Verify)
(Program)

Figure 11:
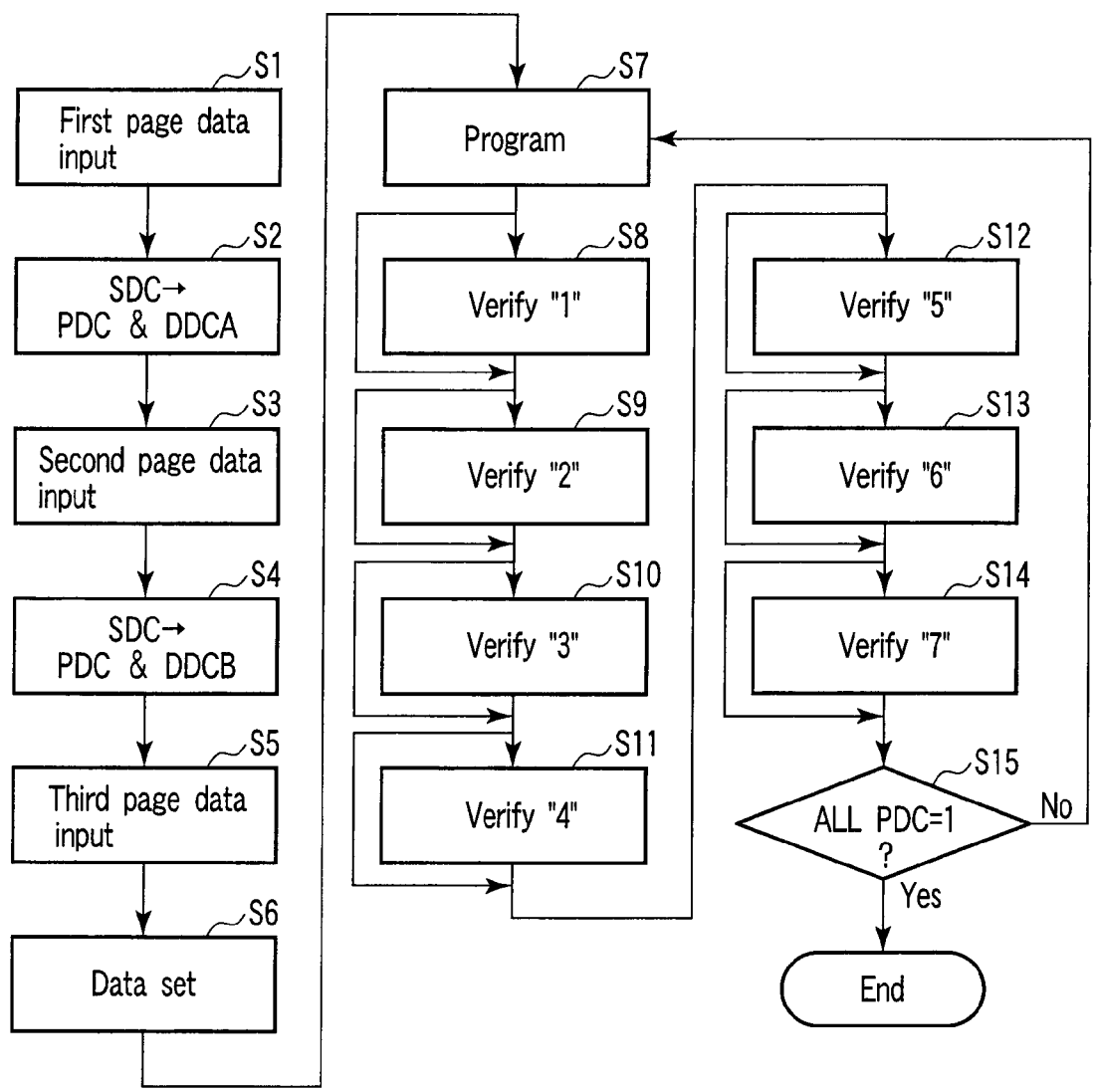
FIG. 11 is a flowchart showing a program operation.

FIG. 11 shows a flowchart of a program operation. In the program operation, first, an address is designated, and then, three pages shown in FIG. 3 are selected.

In the program, data of the first page, second page, and third page constituted of, for example, 2 to 4 kB are input in sequence, and the three pages are simultaneously written. Data of the first page, second page, and third page are transferred from outside to the inside of the bit line control circuit 2 through the controller 11, data input/output terminal 5, and data input/output buffer 4. Of the data, all the data become "1" or "0" in some cases. In the case of such data, the capacitance of the bit line becomes large, and a large current peak is generated sometimes. Further, when all the data patterns in the block are the same, there is sometimes a case where all the data in the NAND cell are "1". In such a case, boost of the cell is enhanced at the time of read, and a problem of miswrite is caused due to gate induced drain leakage (GIDL) or the like. Thus, write data is manipulated in the following manner so that such a data pattern can be prevented from occurring.

In the first method, data is randomized.

In the second method, redundant cell data is added to data to prevent a state where of data of 2 to 4 kB, all the data become "1" or "0".

The above data handling operations can be incorporated in both the NAND flash memory chip and the controller 11. In this embodiment, a conversion circuit 4-1 is provided in, for example, the data input/output buffer 4 shown in FIG. 2. The conversion circuit 4-1 is a circuit for executing the above-mentioned first method, by which data is randomized.

(Data Randomization)

FIG. 1A shows an example of a conversion circuit 4-1. The conversion circuit 4-1 is constituted of, for example, exclusive-OR circuits (hereinafter referred to as EXOR) 4a and 4b, and registers 4c, 4d, 4e, and 4f which are connected in series. These registers 4c to 4f constitute a shift register SFR. The EXOR 4a outputs an exclusive OR of input data and output data of the EXOR 4b. The shift register SFR shifts the output data of the EXOR 4b in sequence through the registers 4c to 4f. The EXOR 4b outputs an exclusive OR of output data of the register 4c and output data of the register 4f.

FIG. 1B shows changes in data held in the registers 4c to 4f. The operation of FIG. 1A will be described below with reference to FIG. 1B.

In the conversion circuit 4-1, output data S(x) of the EXOR 4a is a primitive polynomial used for a recurring code shown by the following equation.

$$S(x)=x^4+x+1$$

In the initial state, although data of each of the registers 4f to 4c is set at a predetermined value as will be described later, the description will be given below assuming that x4=x3=x2=0, and x1=1. In this state, when output data "1" of the EXOR 4a is supplied to the register 4c, the data of the registers 4f to 4c becomes x4=x3=0, and X1=x2=1. Thereafter, each time the output data of the EXOR 4a is input to the register 4c, the data is shifted in sequence from the register 4c to the register 4f side. In this manner, when the data is shifted four times, all the registers 4c to 4f hold "1". Likewise, when the data is shifted fifteen times, the data values return to the initial state. An exclusive OR of the output data and input data of the EXOR 4a is acquired by the EXOR 4b, and the acquired exclusive OR is output. Thus, for example, when all the input data are "1", all the output data become data other than "1". Further, for example, when all the input data are "0", the output data becomes "111101011001000 . . . ".

The initial value of the conversion circuit 4-1 is made to be, for example, the lowerbits of the address of the word line, or lower bits of a value obtained by adding the address of the block to the address of the word line. In the case where setting is made as described above, for example, when the block address is "1", and the address of the word line is "1", the initial value set in the registers 4f to 4c becomes "1"+"1"="2", i.e., $x^4$=0, $x^3$=0, $x^2$=1, and $x^1$=0. In this state, when all the input data are "0" as the data to be input to the EXOR 4a, the data to be output becomes "000111101011001 . . . ". Although all the input data are "0", the initial value is different, and hence the data different from the foregoing data is output.

When the input data from outside is random by chance, there is the possibility of the output of the conversion circuit 4-1 becoming "00000000000 . . . ". However, the input data length is long (2 to 4 kB), and hence the above possibility is very small.

(Redundant Cell Data Addition)

In order to prevent the same data from succeeding, the data length is extended. For example, when, in data of 2 to 4 kB, all the data are "1" or "0", or the number of "1" or "0" is a predetermined number or more, the state where all the data are "1" or "0", or the number of "1" or "0" is a predetermined number or more is prevented from being caused by adding data to the extended bits.

Each of FIGS. 12A and 12B shows an example of a case where redundant cell data is added. In Example 1 shown in FIG. 12A, a case where the data is four bits, and two bits are added is shown for simplification of explanation although the actual data length is 2 to 4 kB. When, in the four bits, more than three bits are "0", two bits of "11" are added, when, in the four bits, more than three bits are "1", two bits of "00" are added, and when the state is other than the above, two bits of "01" are added.

In Example 2 shown in FIG. 12B, a case where the data length is eight bits is shown. When, in the eight bits, more than five bits are "0", two bits of "11" are added, when, in the eight bits, more than five bits are "1", two bits of "00" are added, and when the state is other than the above, two bits of "01" are added.

A circuit for adding two-bit data in accordance with the number of "0" or "1" in the input data in the manner described above can be constituted of, for example, a counter for counting the number of "0" or "1" in the input data, and a selector for selecting bits to be added in accordance with the output data of the counter.

(Data Load)

After preventing the case where all the data in the first page become "0" or "1", all the write data are stored in the SDCs of the data storage circuits 10 shown in FIGS. 3 (4) and 8. After this, when a data transfer command is input, data in the SDCs in all the data storage circuits are transferred to the PDCs and DDCAs.

Next, all the write data in the second page are also stored in the SDCs in the data storage circuits, as in the case of the data in the first pages, after all the data are manipulated such that they do not become the same data. Thereafter, data in the SDCs of all data storage circuits are transferred to the PDCs and DDCBs when a data transfer command is input.

Then, all the write data in the third page are also stored in the SDCs in the data storage circuits, as in the case of the data in the first and second pages, after all the data are manipulated such that they do not become the same data. Thereafter, data is set in each of the PDC, SDC, DDCA, and DDCB in accordance with each write level.

FIGS. 14A, 14B, and 14C show data to be set in the PDC, SDC, DDCA, and DDCB. FIG. 14A shows data of the SDC, DDCA, and DDCB at the time before data setting. FIG. 14B shows data of PDC, SDC, DDCA, and DDCB at the time after the conventional data setting. FIG. 14C shows data of the PDC, SDC, DDCA, and DDCB at the time after the data setting of the present invention.

In the case of non-write, in the data storage circuit 10 shown in FIG. 8, the node N1a of the PDC becomes "H", and in the case of write, the node N1a becomes "L". Hereinafter, it is defined that the data of the PDC is the potential of the node N1a of the data storage circuit, and the data of the SDC is the potential of the node N2a of the data storage circuit.

(Program Operation)

Figure 16:
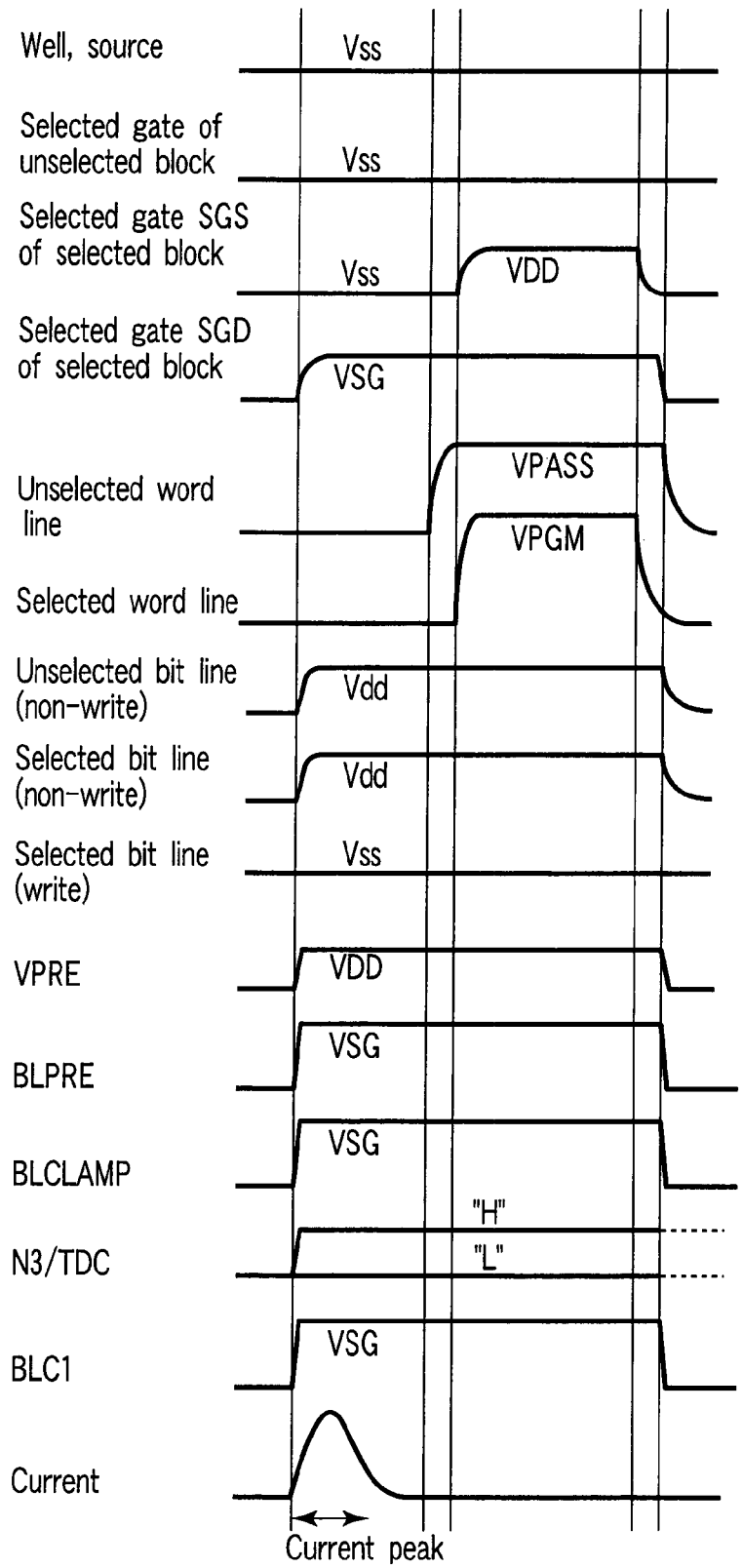
FIG. 16 is a view showing a waveform of each part at the program time.

FIG. 16 shows a waveform of each part at the time of a program operation.

Assuming that the signal BLC1 shown in FIG. 8 is Vdd+ Vth, when data "1" (write is not performed) is stored in the PDC, the potential of the bit line becomes Vdd. Further, when data "0" (write is performed) is stored in the PDC, the potential of the bit line becomes Vss. Further, cells of an unselected page (bit line is unselected) connected to the selected word line must not be written. Thus, Vdd is supplied to the bit line connected to these cells as in the case of data "1".

At this time, when the selected bit line is of write, the bit line is set at Vss, and the unselected bit line is of non-write, and hence the unselected bit line is set at Vdd. Thus, when the capacitance of a certain selected bit line, an unselected bit line, a well and source, and the like is, for example, 4 pF, the capacitance Q of one bit line is obtained from the following equation Q (one bit line)=C (4 pF)×V (2.5 V). Here, for example, when 8 kB is simultaneously written, the capacitance Q is obtained from the following equation Q (8 kB)=8× 1024×8×C (4 pF)×V (2.5 V). Thus, a very large peak current is generated.

Here, Vdd is supplied to the select line SGS of the selected block, VPGM (20 V) is supplied to the selected word line, and VPASS (10 V) is supplied to the unselected word line. Then, when the bit line is at Vss, the channel of the cell is Vss, and the word line is VPGM, and hence write is performed. On the other hand, when the bit line is at Vdd, the channel of the cell is not Vss, and the VPGM is boosted. Thus, VPGM/2 is caused by coupling, and hence program is not performed.

As shown in FIG. 4, when all the cells arranged in the row direction are collectively written, all the bit lines are brought into the selected state. In this case, when the write data is alternately data "1" and data "0", the capacitance between all the bit lines becomes the maximum, and a very large peak current is generated. However, in the case of this embodiment, the write data (for example, one page=2 to 4 kB, for three pages) is manipulated such that the data is uniformly present at eight value levels. Thus, the amount of data to be written to one level is one eighth of the write data.

Figure 13:
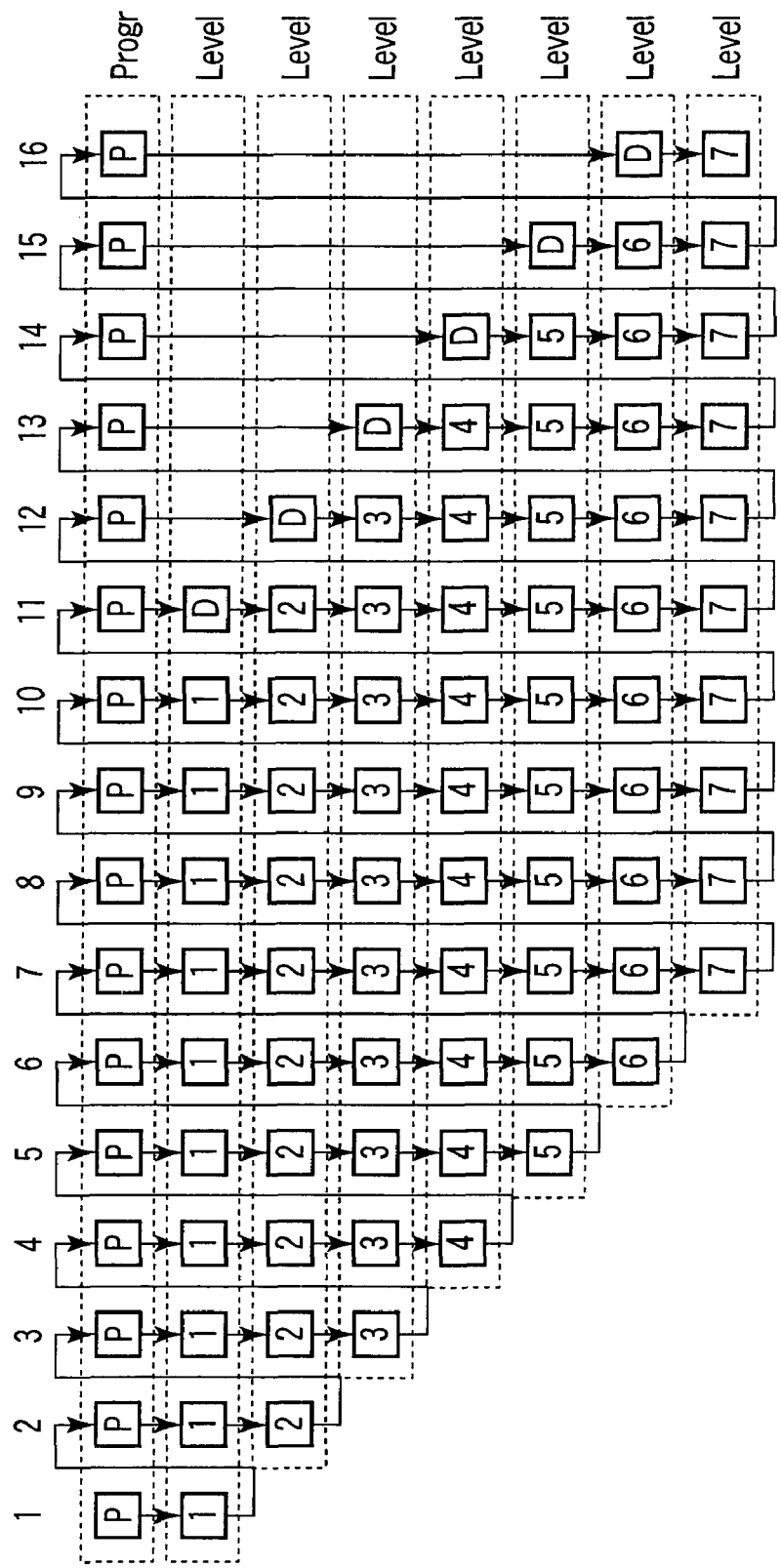
FIG. 13 is a view showing a write sequence, and shows a program and verify.

FIG. 13 shows that program and verify are alternately performed in the write sequence. In this example, write of one level is completed by loops of ten times. Thus, it is assumed that one tenth of the write data is written in each loop.

FIGS. 15A and 15B each show a case where a current peak is generated at the time of write, i.e., a rate at which the bit lines become "0".

A description will be given of a case where half the cells arranged in the row direction are collectively written as shown in FIG. 3. In the conventional case shown in FIG. 15A, when write is performed at any one of the levels, the PDC is set at "0" as shown in FIG. 14B, and when write is not performed, the PDC is set at "1". Accordingly, in the first loop, of the eight levels, seven levels of 1 to 7 are written. In this case, write-completed cells are not present, cells of seven eighths are written. That is, the bit line is set at Vss. Thus, the bit lines alternately become data "1" and data "0", and the maximum peak current is generated.

Further, in the second loop, of the write data, and of the cells (1/8) to be written at level "1", cells of 1/10 are write-completed, and hence cells of 9/10 are written. Further, data to be written at levels of 2 to 7 are not write-completed, all the cells (10/10) are written. Thus, of the write cells, cells of (1/8)×(9/10)+(6/8)×(10/10) are written.

In the third loop, of the cells to be written, and of the cells (1/8) to be written at level "1", cells of 2/10 are write-completed, and hence cells of 8/10 are written. Of the cells (1/8) to be written at level "2", cells of 1/10 are write-completed, and hence cells of 9/10 are written. Data to be written at levels 3 to 7 are not write-completed, all the cells (10/10) are written. Accordingly, of the cells to be written, cells of (1/8)×(8/10)+(1/8)×9/10+(5/8)×(10/10) are written. With a decrease in the number of cells to be written (PDC="0"), the current becomes smaller.

Conversely, in the case of this embodiment shown in FIG. 15B, at first, in only cells to be written at level "1", the PDC is set at "0", and in cells to be written at other levels, the PDC is set at "1" as in the case of non-write as shown in FIG. 14C. Accordingly, in the first loop shown in FIG. 15B, of the write data, only cells of 1/8 are written. In the second loop, of the write data, and of the cells (1/8) to be written at level "1", cells of 1/10 are write-completed, and hence cells of 9/10 are written, and in cells to be written at level "2", the PDC is also set at "0". Cells to be written at level "2" are not write-completed, and hence all the cells (10/10) are written. In cells to be written at levels "3" to "7", the PDC is kept at "1" as in the case of non-write. Accordingly, of the cells to be written, cells of (1/8)×(9/10)+(1/8)×(10/10) are written.

In the third loop, of the write data, and of cells (1/8) to be written at level "1", cells of 2/10 are write-completed, and hence cells of 8/10 are written. Of cells (1/8) to be written at level "2", cells of 1/10 are write-completed, and hence cells of 9/10 are written. In cells to be written at level "3", the PDC is also set at "0". Cells to be written at level "3" are not write-completed, and hence all the cells (10/10) are written, and in cells to be written at levels "4" to "7", the PDC is kept at "1" as in the case of non-write. Accordingly, of the cells to be written, cells of (1/8)×(8/10)+(1/8)×(9/10)+(1/8)×(10/10) are written. Thereafter, the state is as shown in FIG. 15B.

Conventionally, the peak current is maximized in the first loop, which is 0.875 of all the write data, and the average is 0.4648. On the other hand, in the case of this embodiment, the peak current is maximized in the seventh loop, which is 0.6125 of all the write data. The average is 0.3. According to this embodiment, it is possible to prevent the peak current and the current consumption from becoming large.

In the case of this embodiment, data is set in each part of the data storage circuit as shown in FIG. 14C. The data setting is performed in the data setting of step S6 shown in FIG. 11. First, in the same manner as the conventional data setting, data is set in each part of the data storage circuit as shown in FIG. 14B. Thereafter, the signal BLC1 shown in FIG. 8 is set at Vsg (Vdd+Vth), and the data of the PDC is copied to the TDC. Then, the signal VPRE is set at Vdd, the signal REGB is set at Vsg, and the signal REGS is set at Vsg. Then, when the DDCB is "H" or the SDC is "H", i.e., when the write levels are "2" to "7", the TDC is compulsorily made "H". Thereafter, the signal EQ1 is made "H", and the PDC is set at ½×Vdd. Subsequently, the signal BLC1 is set at Vsg, and the data of the TDC is read out to the PDC. The PDC becomes "L" only when the write level is "1", and the PDC becomes "H" at the time of non-write, and when the write levels are "2" to "7". By this operation, only write of the write level of "1" is first performed.

As shown in steps S7 to S15 in FIG. 11, the program and verify operation is repeated, and write at the write level "2" is started. In this case, in the verify operation that has been performed immediately before this, the following operations are performed while a recovery operation of the word line or the like is performed.

The signal BLC1 is set at Vsg (Vdd+Vth), the data of the PDC is copied to the TDC, the signal VPRE is set at Vss, and the signal REGB is set at Vdd. Then, when the DDCB is "H", i.e., when the write levels are "2" and "3", the TDC is compulsorily made "L". Thereafter, the signal VPRE is set at Vdd, and the signal REGA is set at Vsg. Then, when the DDCA is "H", i.e., when the write level is "3", the TDC is compulsorily made "H". Thereafter, the signal EQ1 is made "H", and the PDC is set at ½×Vdd. Then, the signal BLC1 is set at Vsg, and the data of the TDC is read out to the PDC. The PDC becomes "L" only when the write levels are "1" and "2", and the PDC becomes "H" at the time of non-write and when the write levels are "3" to "7".

Further, the program and verify operation shown in steps S7 to S15 in FIG. 11 is repeated, the write at the write levels "3" to "7" is started. In this case, the same operations as described above are performed while a recovery operation of the word line or the like of the verify operation to be performed immediately before this is performed.

In this embodiment, as shown in FIGS. 13 and 15B, the number of loops for starting the verify, and the number of loops for setting the PDC at "0" in the program are the same. That is, the PDC has been set at "0" from the program before performing the verify. However, the numbers of loops is not necessarily the same, and the PDC may be set at "0", and the program may be performed before the loops for starting the verify are started.

(Program Verify Read)

The write is performed by the program operation from the level in which the threshold voltage is low. Thus, as shown in FIG. 13, at the beginning of the program sequence, only the level "1" is verified, and only the level "1" and level "2" are verified in the next loop. In this way, each time the number of loops is increased, the verify level is increased. In the course of the program sequence, all the levels are verified. In the final stage of the program, cells of the lower write levels are already write-completed, and hence the verify can be omitted. Thus, in the twelfth loop and in the subsequent loops, the number of verify operations is reduced, and in the last loop, only the verify of the level "F" is performed. The program verify operation is almost identical with the read operation.

First, the well, source line, and unselected bit line of the selected cell are set at Vss. A potential "a'" slightly higher than the potential "a'" at the time of read is applied to the selected word line. Hereinafter, "'" indicates a verify potential, and the potential has a value somewhat higher than the read potential.

Then, the signal VPRE in the data storage circuit 10 shown in FIG. 8 is set at Vdd (for example, 2.5 V), and the signal BLPRE is set at Vsg (Vdd+Vth). Further, a voltage of, for example, (0.6 V+Vth) is temporarily supplied to the signal BLCLAMP, and the bit line is pre-charged to, for example, 0.6 V.

At this time, the selected bit line is 0.6 V, and the unselected bit line is of non-write, and hence the unselected bit line is Vss. Thus, when the capacitance of a certain selected bit line, unselected bit line, well and source, and the like is, for example, 4 pF, the capacitance Q of one bit line is obtained from the following equation Q (one bit line)=C (4 pF)×V (0.6 V). For example, when 8 kB is simultaneously written, the capacitance Q is obtained from the following equation $$Q(8 \text{ kB})=8\times1024\times8\times C \text{ (4 pF)}\times V \text{ (0.6 V)}.$$

Thus, a very large peak current is generated.

Conventionally, all the selected bit lines are pre-charged. However, in this embodiment, only the bit lines actually subjected to the verify operation are pre-charged. As shown in FIG. 13, at first, in the first loop, only the verify at the level "1" is performed. Thus, only the bit lines to be subjected to the verify at the level "1" are pre-charged. That is, only 1/8 of the write cells are pre-charged. In the second loop, only the verify at the levels "1" and "2" is performed. Thus, only the bit lines to be subjected to the verify at the levels "1" and "2" are pre-charged. It is assumed that 1/10 of the write at the level "1" is already write-completed. Thus, only (1/8)×(9/10)+(1/8) of the write data is pre-charged. In the third loop, only the verify at the level "1", level "2", and level "3" is performed. Thus, only the bit lines to be subjected to the verify at the level "1", level "2", and level "3" are pre-charged. It is assumed that 2/10 of the write at the level "1" is already write-completed, and 1/10 of the write at the level "2" is already write-completed. Thus, only (1/8)×(8/10)+(1/8)×(9/10)+(1/8) of the write data is pre-charged.

As a result of this, the current necessary for the pre-charge is, at the maximum, 0.6125 times of the current necessary for pre-charging all the selected bit lines. Thus, it is possible to prevent the current peak from occurring. However, when the load of the pre-charge is changed, there is the possibility of the pre-charge level being changed. Accordingly, when the pre-charge current is smaller than the above value, a dummy load is added such that the current becomes 0.6125 of the maximum pre-charge current.

FIG. 18 shows an example in which a dummy load is added at the time of write. For example, in loop 1, at the time of verify at the level "1", the bit lines for the write at the levels "2" to "5" are also pre-charged as the dummy load. Further, in loop 16, at the time of verify at the level "7", the bit lines for the write at the levels "4" to "7" are also pre-charged as the dummy load.

Further, in loop 2, at the time of verify at the levels "1" and "2", the bit lines for the write at the levels "3" to "5" are also pre-charged as the dummy load. In loop 3, at the time of verify at the levels "1", "2", and "3", the bit lines for the write at the levels "4" and "5" are also pre-charged as the dummy load. In loop 4, at the time of verify at the levels "1" to "4", the bit line for the write at the level "5" is also pre-charged as the dummy load.

Further, in loop 8, at the time of verify at the levels "1" to "7", the bit lines for the write at the levels "6" and "7" are pre-charged as the dummy load. In loop 9, at the time of verify at the levels "1" to "7", the bit lines for the write at the levels "5", "6", and "7" are pre-charged as the dummy load. In loop 10, at the time of verify at the levels "1" to "7", the bit lines for the write at the levels "5", "6", and "7" are pre-charged as the dummy load. In loop 11, at the time of verify at the levels "2" to "7", the bit lines for the write at the levels "5", "6", and "7" are pre-charged as the dummy load. In loop 12, at the time of verify at the levels "3" to "7", the bit lines for the write at the levels "4" to "7" are pre-charged as the dummy load. In loop 13, at the time of verify at the levels "4" to "7", the bit lines for the write at the levels "4" to "7" are pre-charged as the dummy load. In loop 14, at the time of verify at the levels "5" to "7", the bit lines for the write at the levels "4" to "7" are pre-charged as the dummy load. In loop 15, at the time of verify at the levels "6" and "7", the bit lines for the write at the levels "4" to "7" are pre-charged as the dummy load. Accordingly, in loops 5 to 7, only the bit lines which are the object of the verify are pre-charged, and in loops 1 to 4, and 8 to 12, the bit lines of the verify object, and the bit lines to which the dummy load is connected are pre-charged. Further, in loops 13 to 16, the bit lines to which the dummy load is connected are pre-charged.

As described above, as for the pre-charge of the bit lines, only the bit lines which are the object of the verify, or the bit lines which are the object of the verify, and the bit lines as the dummy load are pre-charged. Accordingly, in the loop (S7 to S15) of the program and verify shown in FIG. 11, in the verify of the verify i (i: 1 to 7), only the bit line of the cell in which write is performed at the level "i", or the bit line and bit lines as the dummy load are charged. Thus, immediately before the verify operation of the verify i, i.e., during the recovery of the program, or during the recovery of the verify of the preceding level, the following operations are performed.

For example, immediately before verify 1, data of each data cache is set as shown in FIG. 14C. Thus, the signal BLPRE is set at Vdd, signal VPRE is set at Vss, thus TDC is set at Vss, signal VPRE is set at Vdd, and signal REGQ is set at Vsg, then when the DDCQ is "H", the data of the signal TDC becomes "H". After this, the signal DTGQ is made "H", and the data of the PDC is transferred to the DDCQ. After this, the signal EQ1 is made "H", the PDC is set at ½×Vdd, then the signal BLC1 is set at Vsg, and the data of the TDC is read out to the PDC.

Then, the signal BLPRE is set at Vsg, signal VPRE is set at Vdd, thus TDC is set at "H", signal VPRE is set at Vss, and signal REGQ is set at Vdd, then when the DDCQ is "H", the data of the TDC becomes "L". Thereafter, the signal DTGQ is made "H", and data of the PDC is transferred to the DDCQ. After this, the signal EQ1 is made "H", the PDC is set at ½×Vdd, then the signal BLC1 is set at Vsg, and the data of the TDC is read out to the PDC. As a result of this, the data stored in the PDC is inverted. That is, when write is performed at level "1", the data of the PDC becomes "H", and otherwise "L".

Thereafter, the signal BLPRE is set at Vdd, signal VPRE is set at Vss, thus TDC is made "L", signal VPRE is set at Vdd, and signal REGQ is set at Vsg. Then, when DDCQ is "H", the TDC becomes "H". Thereafter, the signal DTGQ is made "H", and the data of the PDC is transferred to the DDCQ. After this, the signal EQ1 is made "H", PDC is set at ½×Vdd, signal BLC1 is set at Vsg, and the data of the TDC is read out to the PDC. As a result of this, the data of the PDC is transferred to the DDCQ, and the data of the DDCQ is transferred to the PDC. Further, the DDCQ becomes "H" only when write is performed at level "1".

Normally, in the data storage circuit 10 shown in FIG. 8, the signal VPRE is set at Vdd (for example, 2.5 V), signal BLPRE is set at Vsg (Vdd+Vth), signal BLCLAMP is set at, for example, (0.6 V+Vth), and the bit line is pre-charged to, for example, 0.6 V. However, the signal VPRE is set at Vdd, signal REGQ is set at Vvsg, signal BLCLAMP is set at, for example, (0.6 V+Vth), and only when write is performed at level 1 is the bit line is pre-charged. Only in cells (during write, PDC="L") in which write is performed by the same operation as described above is the bit line charged (during verify, DDCQ="H") by the verify operation, and in cells (during write, PDC="H") in which write is not performed, the bit line is not charged (during verify, DDCQ="L") by the verify operation, and only bit lines which are the object of the write verify are charged. In the manner described above, the data of the PDC which holds data at the time of the write is inverted when the bit line being verified is charged, whereby it is possible to charge only the bit line of a cell in which write is performed, i.e., a cell which is an object of the verify.

While the bit line is discharged, the data of the DDCQ is inverted, and is moved to the TDC, thereafter, the data of the PDC is moved to the DDCQ, and the data of the TDC is moved to the PDC. Thus, the DDCQ holds the original data, and the PDC also holds the original data indicating write or non-write. Thereafter, the data of the DDCQ is moved to the TDC, then the data of the PDC is moved to the DDCQ, and the data of the TDC is moved to the PDC. Here, the signal BLPRE of the data storage circuit shown in FIG. 8 is set at Vsg (Vdd+Vth), the node of the TDC is pre-charged to Vdd, and then the signal BLCLAMP is set at, for example, (0.45 V+Vth). When the bit line is lower than 0.45 V, the node of the TDC becomes "L", and when the bit line is higher than 0.45 V, the node of the TDC is kept at "H". Here, the signal VPRE is set at Vss, and then the signals REGA, REGB, and REGS are made "H" or "L" in accordance with the table shown in FIG. 17. For example, in the case of verify at level 1, when the signals REGB, and REGS are made "H", the TDC of a data storage circuit written at a level higher than the verify level is compulsorily made "L", and a verify pass is not obtained in this verify. Subsequently, the signal VPRE is set at "H", and REGQ is set at "H", and when the DDCQ is "H" (non-write), the TDC is compulsorily made "H". However, when the DDCQ is "L" (write), the value of the TDC is not changed. Here, after the data of the PDC is moved to the DDCQ, the signal BLC1 is set at Vsg (Vdd+Vth), and the potential of the TDC is read out to the PDC. Thus, when the PDC is originally set at "L" (write), when the threshold of the cell is lower than the level "a'", the PDC becomes "L" (write) again, and when the threshold is higher than the level "a'", the PDC becomes "H". Thus, the PDC is set at non-write from the next program loop. Further, when the PDC is originally set at "H" (non-write), the PDC becomes "H", and is set at non-write from the next program loop.

Subsequently, the levels of the selected word line are set at "b'", "c'", "d'", "e'", "f'", and "g'", and each data cache of the data storage circuit 10 is operated in the same manner.

When the PDC is "L", the write operation is performed again, and the program operation and the verify operation are repeated until data of all the data storage circuits 10 becomes "H".

As shown in FIG. 13, when all the write operations at level "1" are completed, a verify operation at level "1" is not performed in the next loop. However, when a verify operation at level "2" is first performed, a verify operation at level "1" is performed as a dummy operation. When write operations at level "1" and level "2" are all completed, a verify operation is not performed at level "1" and level "2" from the next loop. However, when a verify operation at level "3" is first performed, a verify operation at level "2" is performed as a dummy operation. At the verify level for which write is completed in this manner, a verify operation is not performed. However, a verify operation of the preceding level is performed as a dummy operation. This is because the potential of the source line is floated at the beginning of each verify level, and the verify operation must be made a verify operation in the case where the source potential is not floated. However, when this does not become a problem, the dummy operation can be omitted.

Incidentally, in this embodiment, charging of the bit line at the time of program, and the operation of the bit line at the time of verify are selectively performed only at the objective level. However, these are not necessarily performed as a set, and only one of them may be performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of memory cells, in which a plurality of data are stored at i levels of level "0", and level "1" to level "(i−1)" (i is a natural number equal to 1 or larger); and
a control section configured to simultaneously write data to n (n is a natural number equal to 1 or larger) cells of the plural memory cells, wherein when the n memory cells are written, the control section performs a write operation and a write verify operation, when, in the write verify operation, m (m≦n) cells to be simultaneously written are not yet written, the control section repeats the write operation and the write verify operation again, and writes only write cells at lower levels at the beginning of the repeated operations.

2. The device according to claim 1, wherein in the write verify operation, the control section charges only bit lines connected to memory cells to be verified.

3. The device according to claim 1, wherein at the benning of the repeated operations, at the time of verify at the lowest level, the control section charges a bit line connected to at least a memory cell in which a write operation is performed at a level higher than the lowest level as a dummy load.

4. The device according to claim 3, wherein in the final stage of the repeated operations, at the time of verify at the highest level, the control section charges a bit line connected to at least a memory cell in which a write operation is performed at a level lower than the highest level as a dummy load.

* * * * *